US006235634B1

(12) United States Patent
White et al.

(10) Patent No.: US 6,235,634 B1
(45) Date of Patent: May 22, 2001

(54) MODULAR SUBSTRATE PROCESSING SYSTEM

(75) Inventors: John M. White, Hayward; Robert B. Conner, Mountain View; Kam S. Law, Union City; Norman L. Turner, Mountain View; William T. Lee, Pleasanton; Shinichi Kurita, San Jose, all of CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 09/082,483

(22) Filed: May 20, 1998

Related U.S. Application Data

(63) Continuation-in-part of application No. 08/946,922, filed on Oct. 8, 1997.

(51) Int. Cl.[7] .................................................. H01L 21/44
(52) U.S. Cl. .................. 438/680; 118/719; 118/725; 118/715; 118/728; 204/192.12; 204/297; 204/298.25; 204/298.35; 414/217; 414/225
(58) Field of Search ........................ 438/680; 204/192.12, 204/298.25, 298.35, 297; 118/719, 725, 715, 728; 414/217, 225

(56) References Cited

U.S. PATENT DOCUMENTS

| 3,850,105 | 11/1974 | Aronstein et al. ............ 104/1 R |
| 3,973,665 | 8/1976 | Giammanco ................... 198/19 |
| 3,976,330 | 8/1976 | Babinski et al. ............. 302/2 R |
| 4,047,624 | 9/1977 | Dorenbos . | |

(List continued on next page.)

FOREIGN PATENT DOCUMENTS

| 2114470 | 9/1972 | (DE) . | |
| 3941110A1 | 6/1990 | (DE) | ............... C23C/14/24 |
| 0 359 525 A2 | 3/1990 | (EP) . | |
| 0359525 A2 | 3/1990 | (EP) | ............... H01L/21/00 |
| 0 608 633 A2 | 8/1994 | (EP) . | |
| 0 684 630 A2 | 11/1995 | (EP) . | |
| 0 756 316 A1 | 1/1997 | (EP) . | |
| 0756316 A1 | 1/1997 | (EP) | ............... H01L/21/00 |
| 2171119A | 8/1986 | (GB) | ............... C23C/14/56 |
| 3-136345 | 6/1991 | (JP) . | |
| 08274142 | 3/1995 | (JP) | ............... H01L/21/68 |
| WO 94/00868 | 1/1994 | (WO) | ............ H01L/21/00 |
| WO 98/02911 | 1/1998 | (WO) | ............ H01L/21/00 |

*Primary Examiner*—Richards Elms
*Assistant Examiner*—Pho Luu
(74) *Attorney, Agent, or Firm*—Thomason, Moser & Patterson, LLP

(57) ABSTRACT

The invention provides an apparatus and method for performing a process on a substrate. At least two types of structures may be used to provide a flow path for a substrate so that the substrate may be moved from one processing or loading position to another. The first is a conveyor. The second is a track. The flow path may be a closed continuous loop. Each processing island has a valve for introduction and extraction of the substrate into and out of an interior of the island. The processing island may include load locks, and may include in conjunction therewith an inspection station, a CVD chamber, a PECVD chamber, a PVD chamber, a post-anneal chamber, a cleaning chamber, a descumming chamber, an etch chamber, or a combination of such chambers.

83 Claims, 13 Drawing Sheets

U.S. PATENT DOCUMENTS

| | | | |
|---|---|---|---|
| 4,749,465 | 6/1988 | Flint et al. | 204/298 |
| 4,775,281 | 10/1988 | Prentakis | 414/416 |
| 4,829,445 | 5/1989 | Burney | 364/478 |
| 4,951,601 | 8/1990 | Maydan et al. | 118/719 |
| 4,985,722 | 1/1991 | Ushijima et al. | 354/319 |
| 5,001,327 | 3/1991 | Hirasawa et al. | 219/390 |
| 5,060,354 | 10/1991 | Chizinsky | 29/25 |
| 5,086,729 | 2/1992 | Katagiri | 118/729 |
| 5,110,249 | 5/1992 | Norman | 414/217 |
| 5,178,638 | 1/1993 | Kaneko et al. | 29/25.01 |
| 5,187,115 | 2/1993 | Coleman . | |
| 5,203,443 | 4/1993 | Toriumi et al. | 198/341 |
| 5,227,708 | 7/1993 | Lowrance | 318/640 |
| 5,252,807 | 10/1993 | Chizinsky | 219/390 |
| 5,259,883 | 11/1993 | Yamabe et al. | 118/725 |
| 5,275,709 | 1/1994 | Anderle et al. | 204/298.25 |
| 5,288,379 | 2/1994 | Namiki et al. | 204/192 |
| 5,355,066 | 10/1994 | Lowrance | 318/640 |
| 5,377,816 | 1/1995 | Deligi et al. | 198/619 |
| 5,382,126 | 1/1995 | Hartig et al. | 414/217 |
| 5,447,409 | 9/1995 | Grunes et al. | 414/744 |
| 5,469,035 | 11/1995 | Lowrance | 318/568.1 |
| 5,470,784 | 11/1995 | Coleman . | |
| 5,505,779 * | 4/1996 | Mizuno et al. | 118/719 |
| 5,512,320 | 4/1996 | Turner et al. | 427/255 |
| 5,535,306 | 7/1996 | Stevens | 395/89 |
| 5,536,128 | 7/1996 | Shimoyashiro et al. | 414/273 |
| 5,537,311 | 7/1996 | Stevens | 364/167.01 |
| 5,607,009 | 3/1997 | Turner et al. . | |
| 5,628,828 * | 5/1997 | Kawamura et al. | 118/719 |
| 5,674,786 | 10/1997 | Turner et al. . | |
| 5,701,627 | 12/1997 | Matsumura et al. | 15/88.2 |
| 5,838,121 * | 11/1998 | Fairbairn et al. | 318/45 |
| 5,855,681 * | 1/1999 | Maydan et al. | 118/719 |
| 5,881,649 | 3/1999 | Hasegawa et al. | 104/167 |
| 5,961,269 * | 10/1999 | Kroeker | 414/221 |
| 5,976,199 | 11/1999 | Wu et al. | 29/25.01 |

* cited by examiner

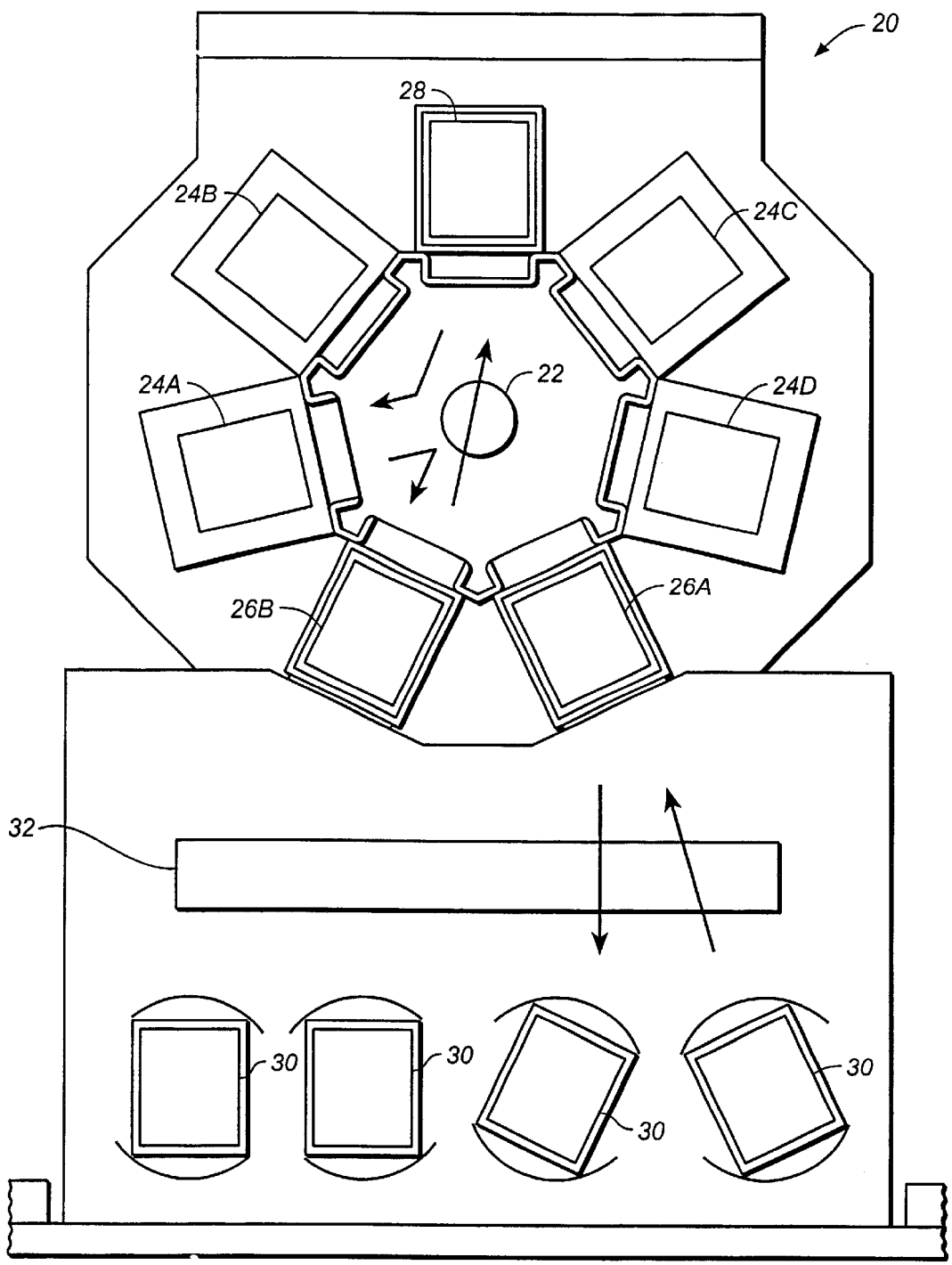
*FIG._1* (PRIOR ART)

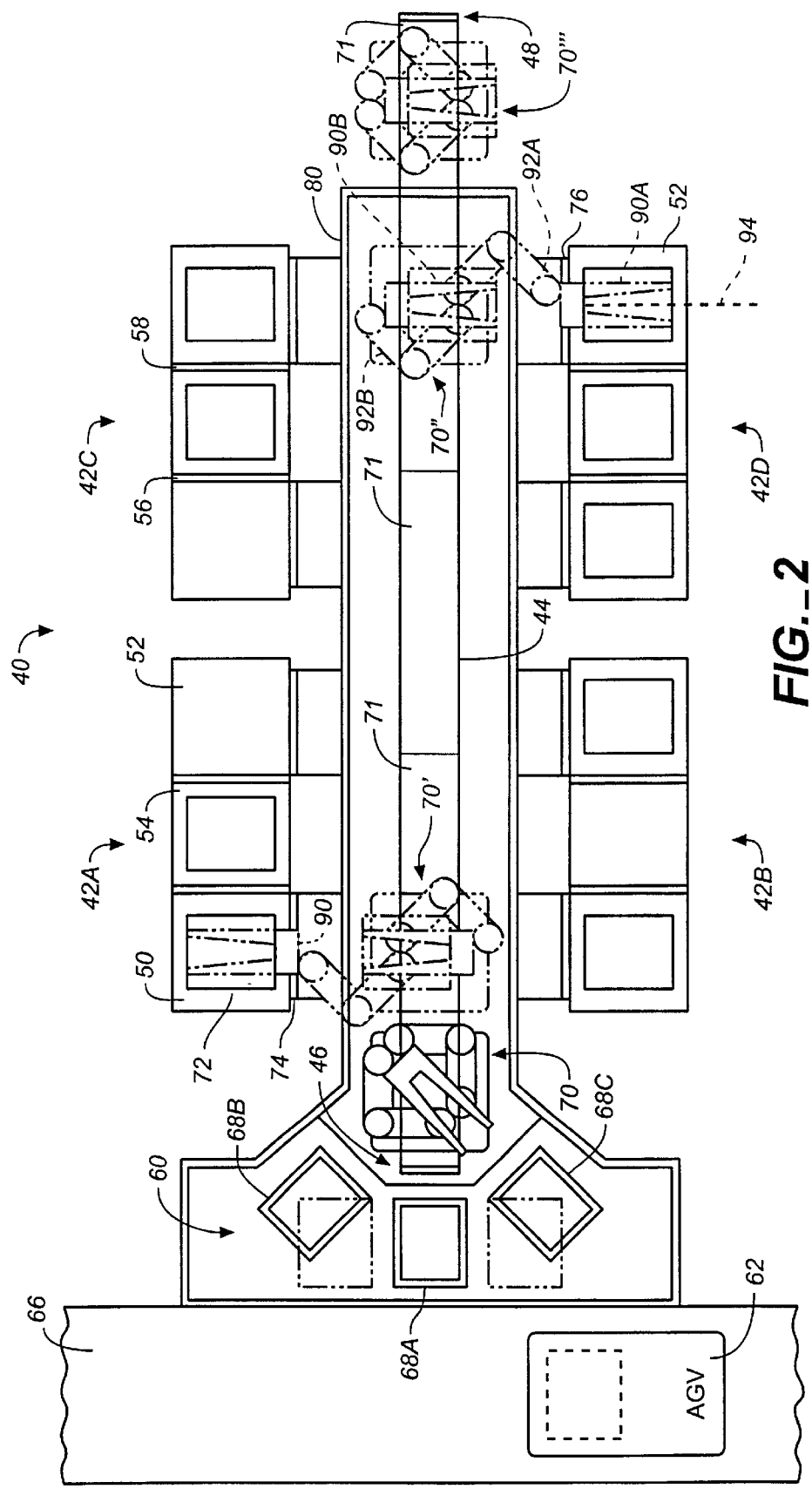
FIG._2

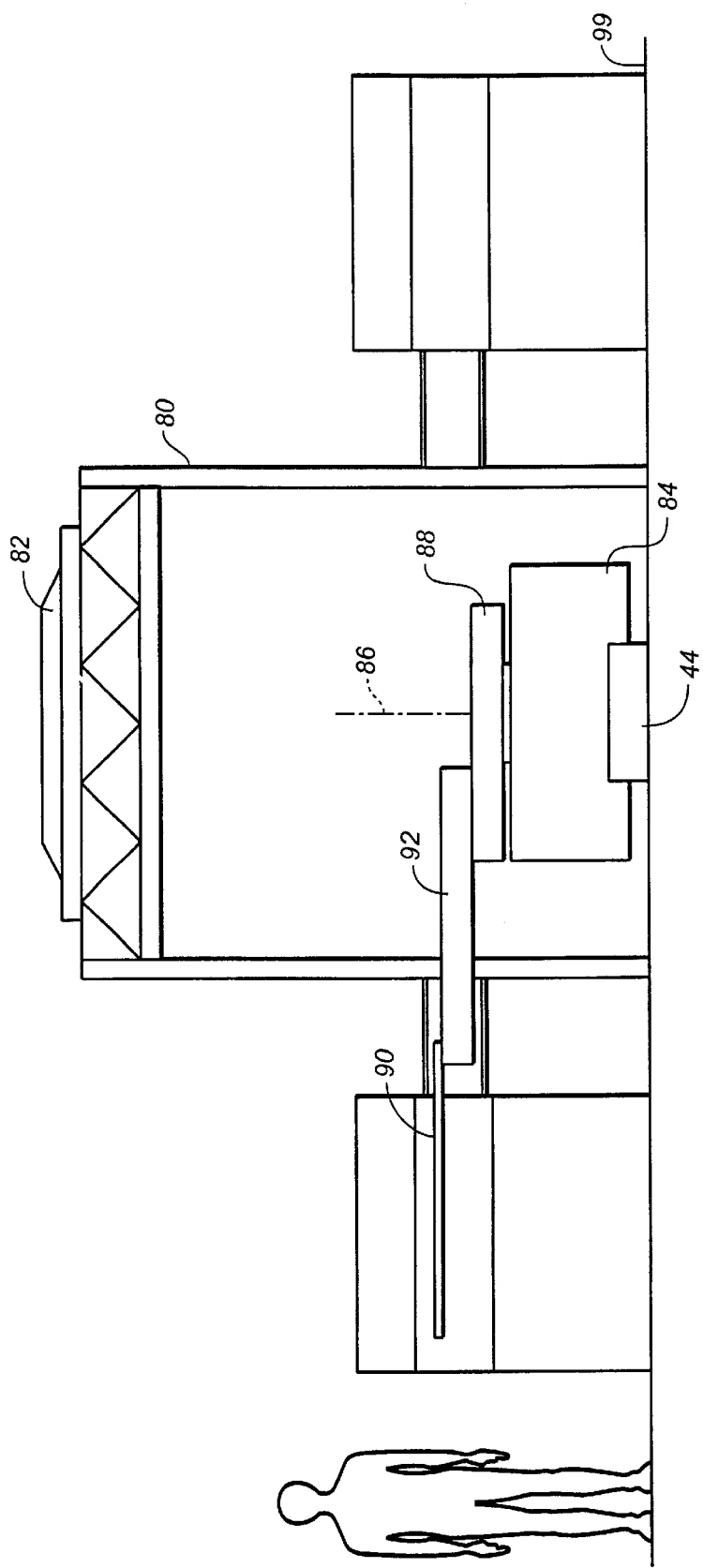

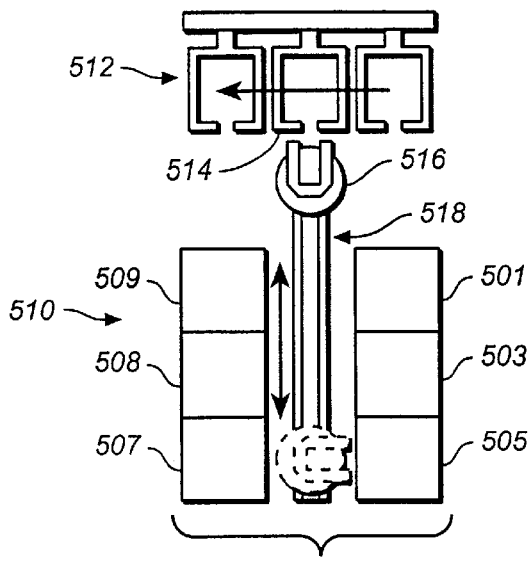
*FIG._4*
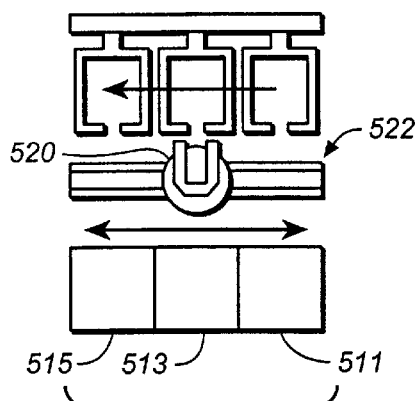
*FIG._5*
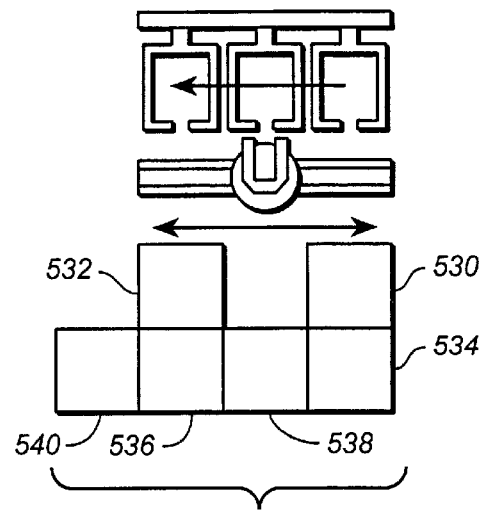
*FIG._7*
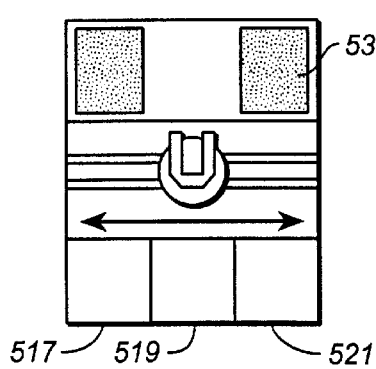
*FIG._6*
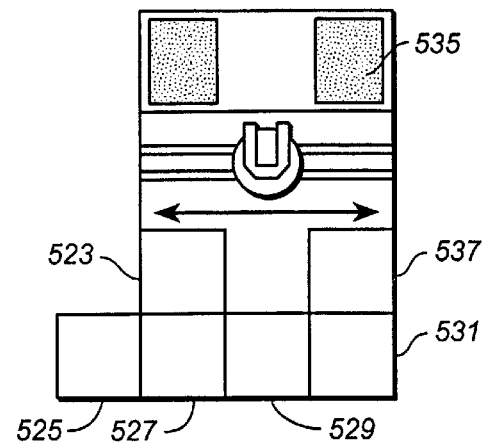
*FIG._8*

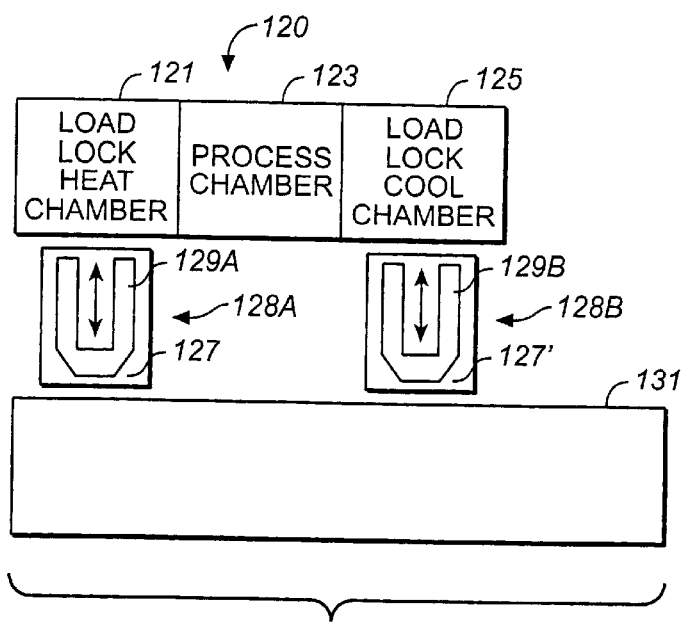
FIG._9
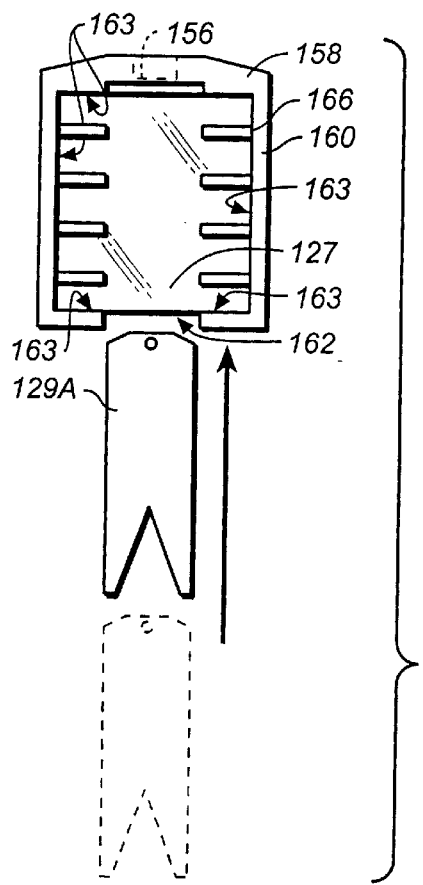
FIG._12
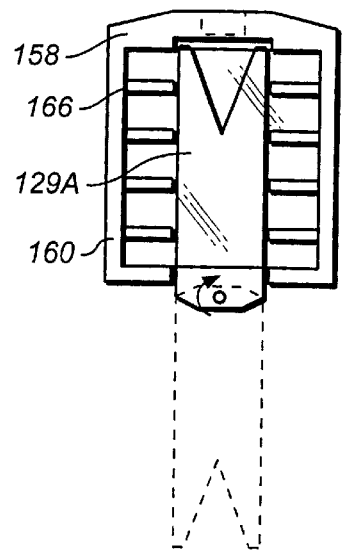
FIG._13

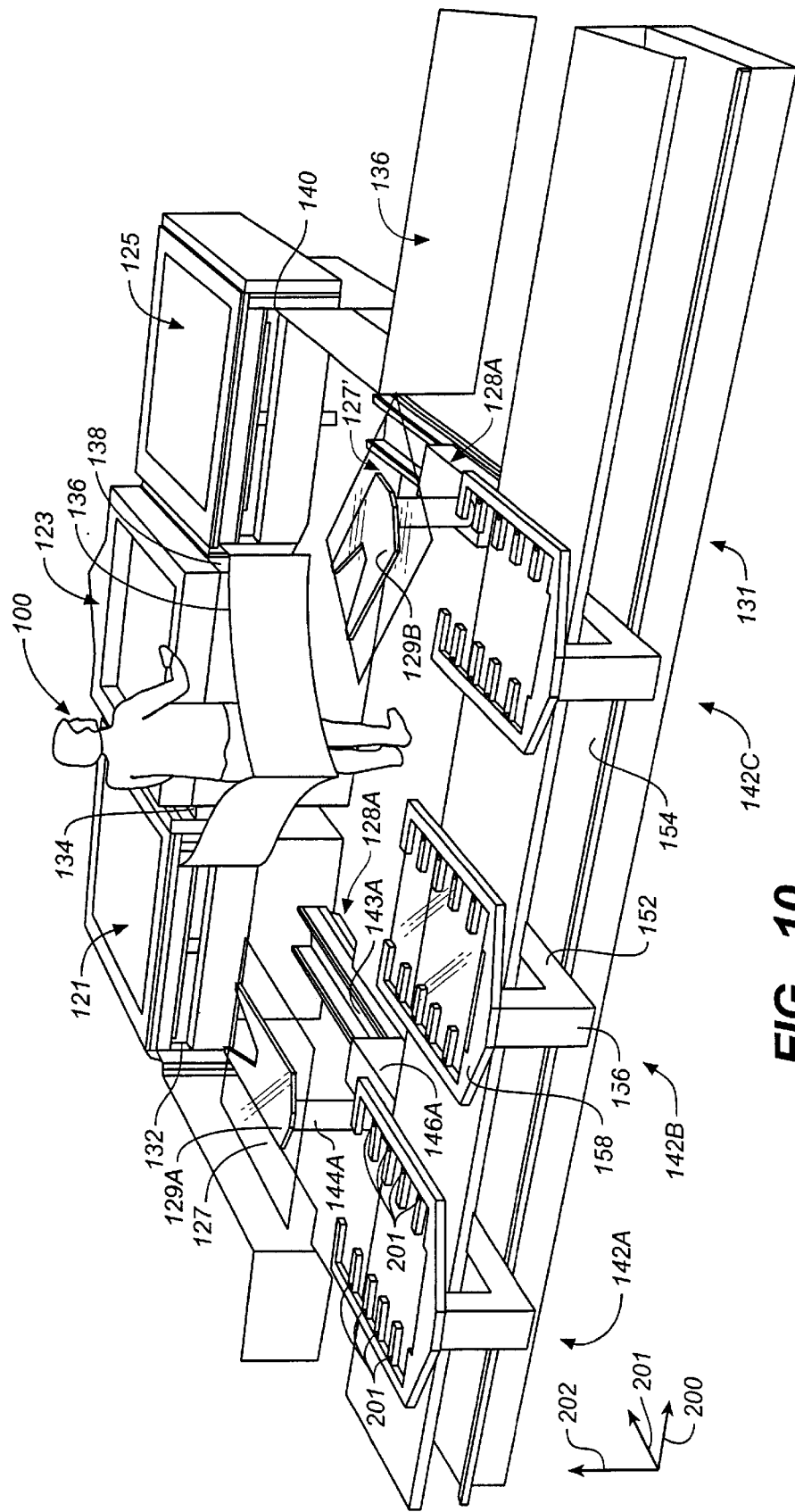

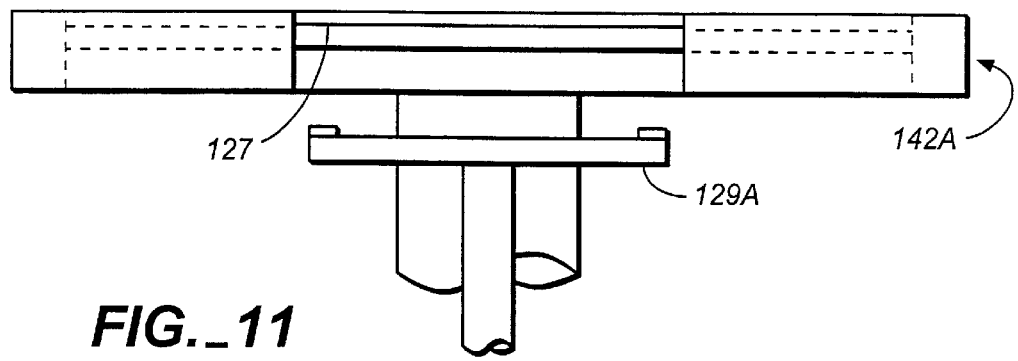
FIG._11
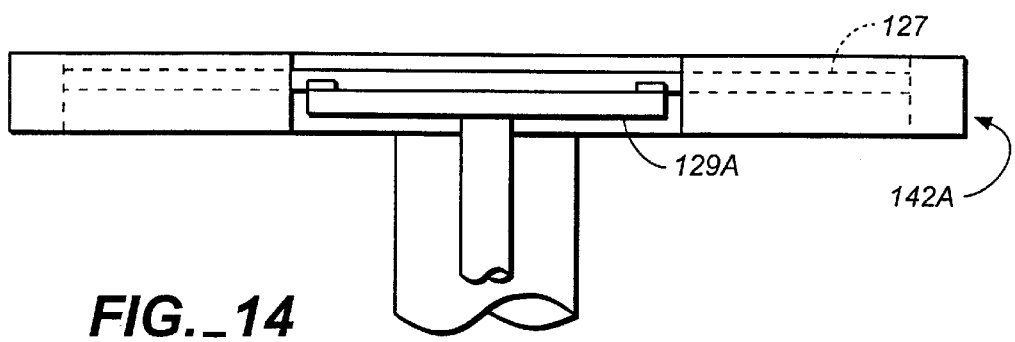
FIG._14
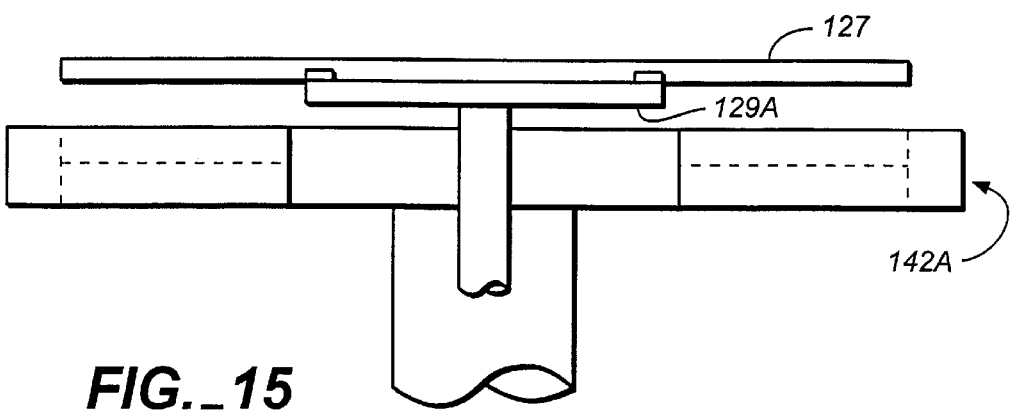
FIG._15

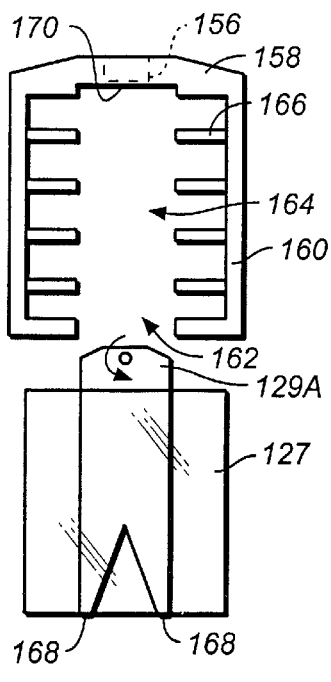
FIG._16
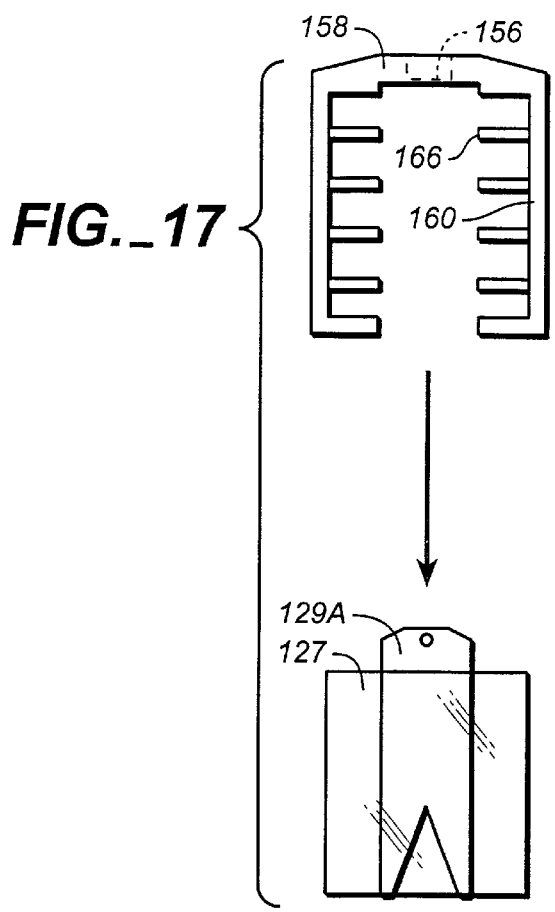
FIG._17
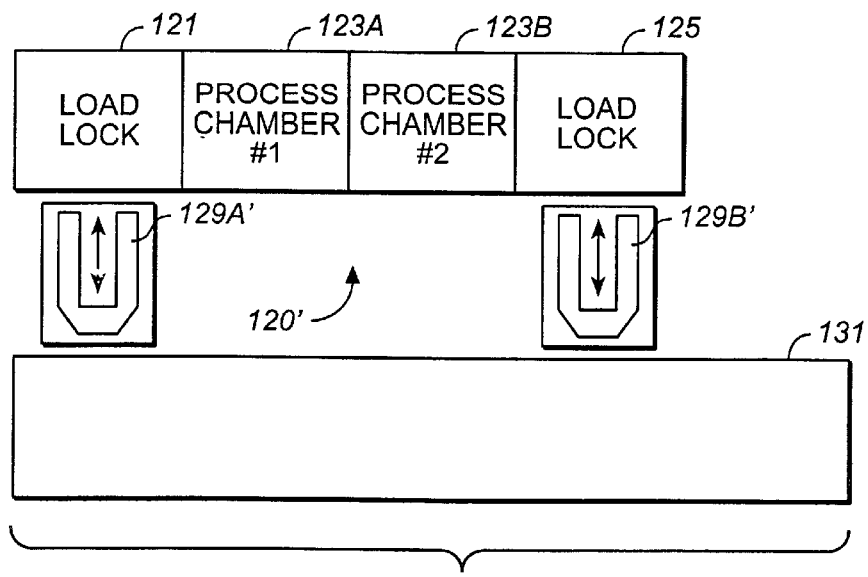
FIG._18

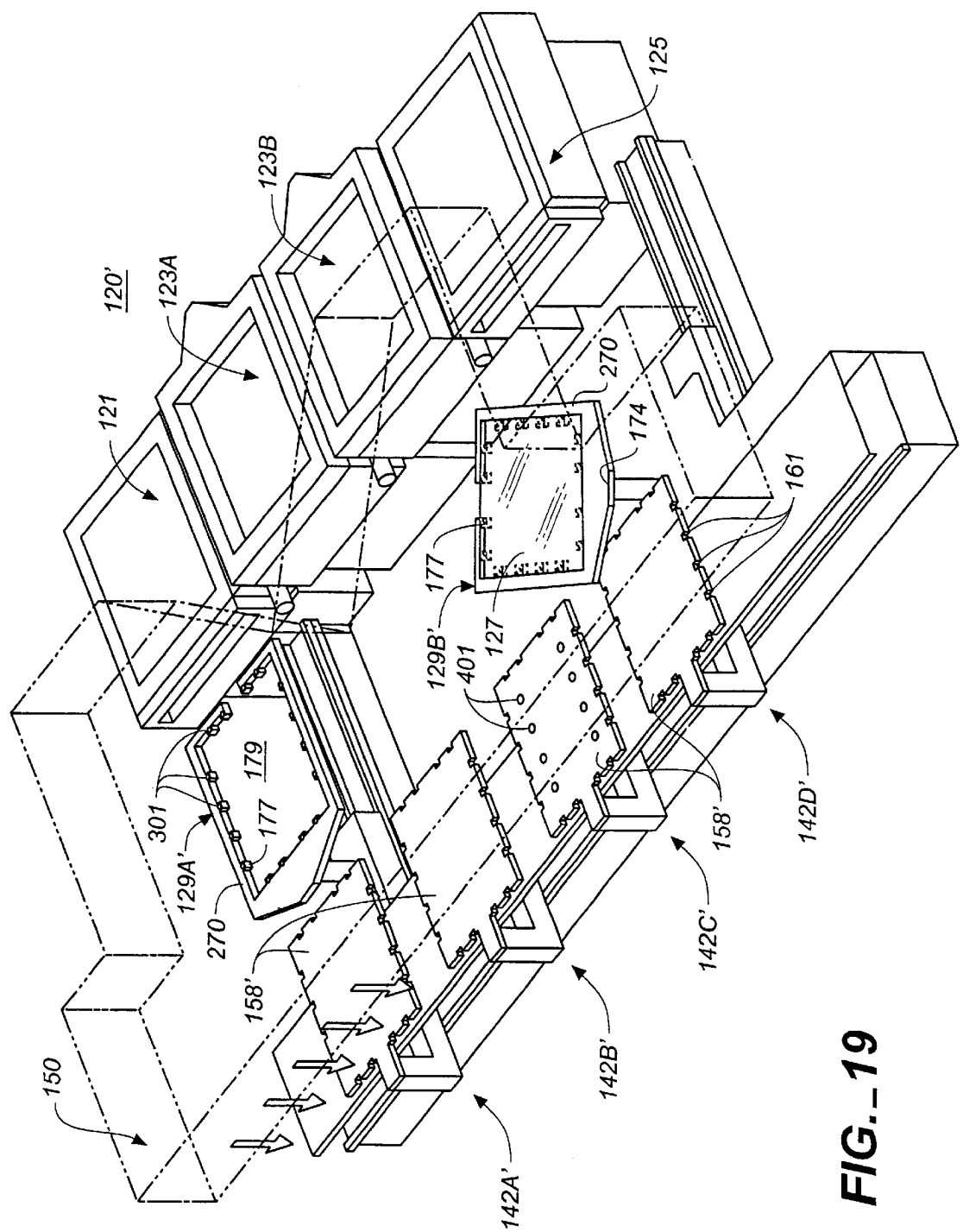
FIG._19

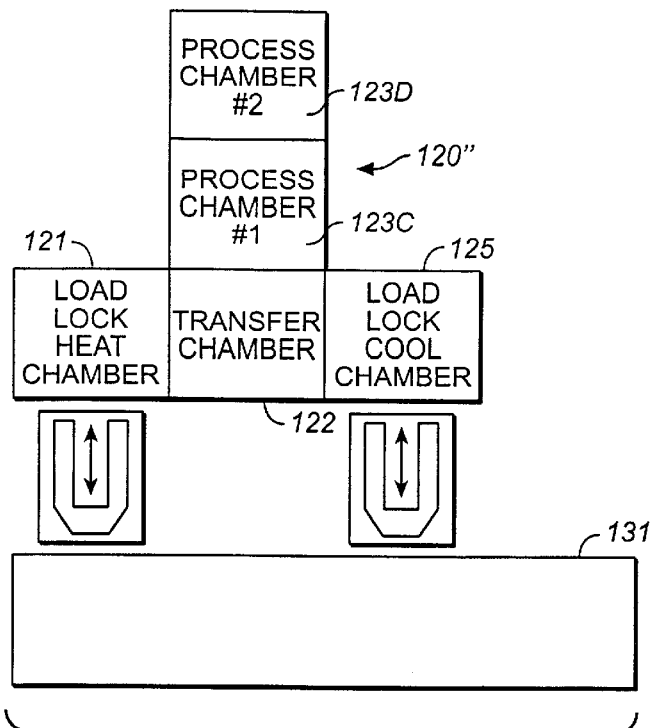
FIG._20
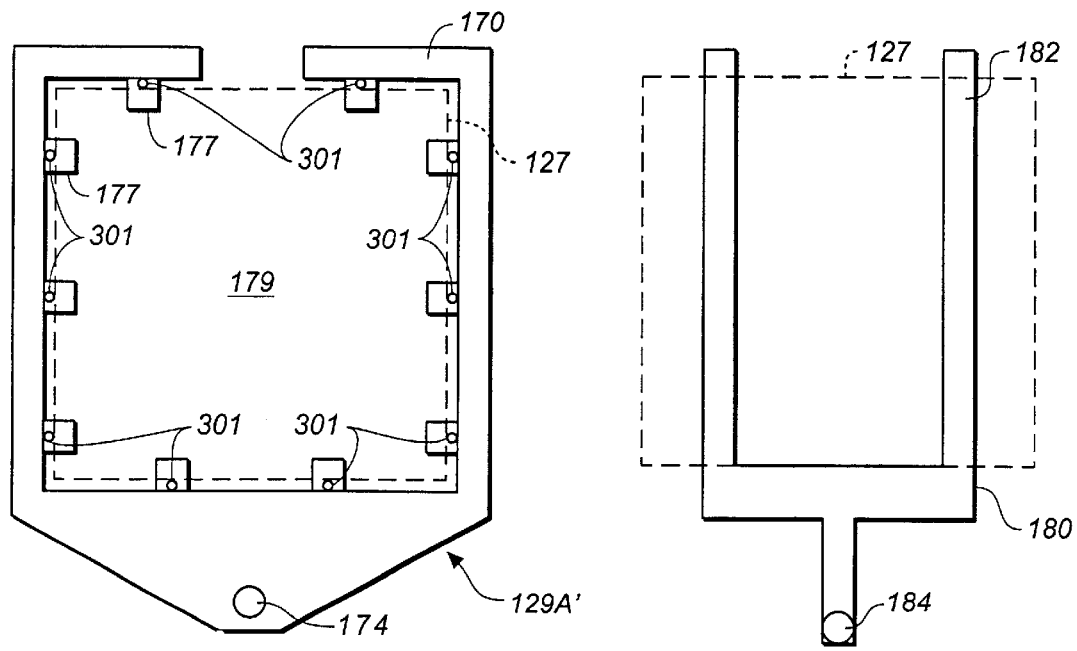
FIG._21  FIG._22

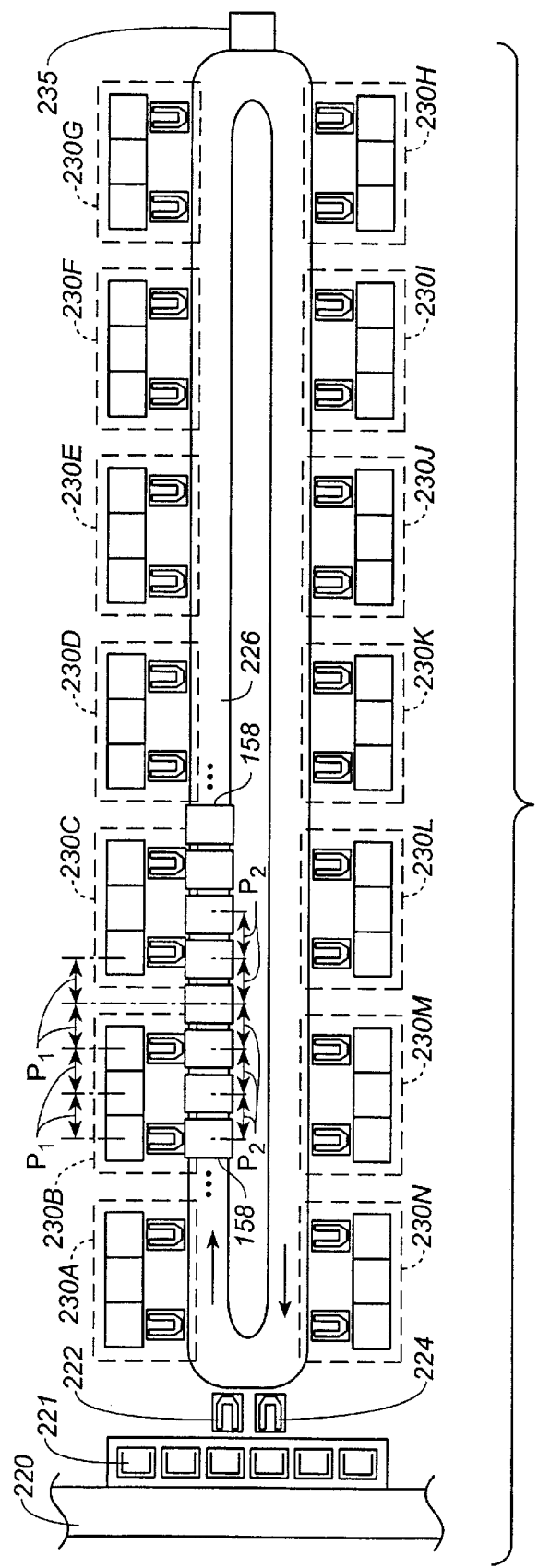
FIG._23

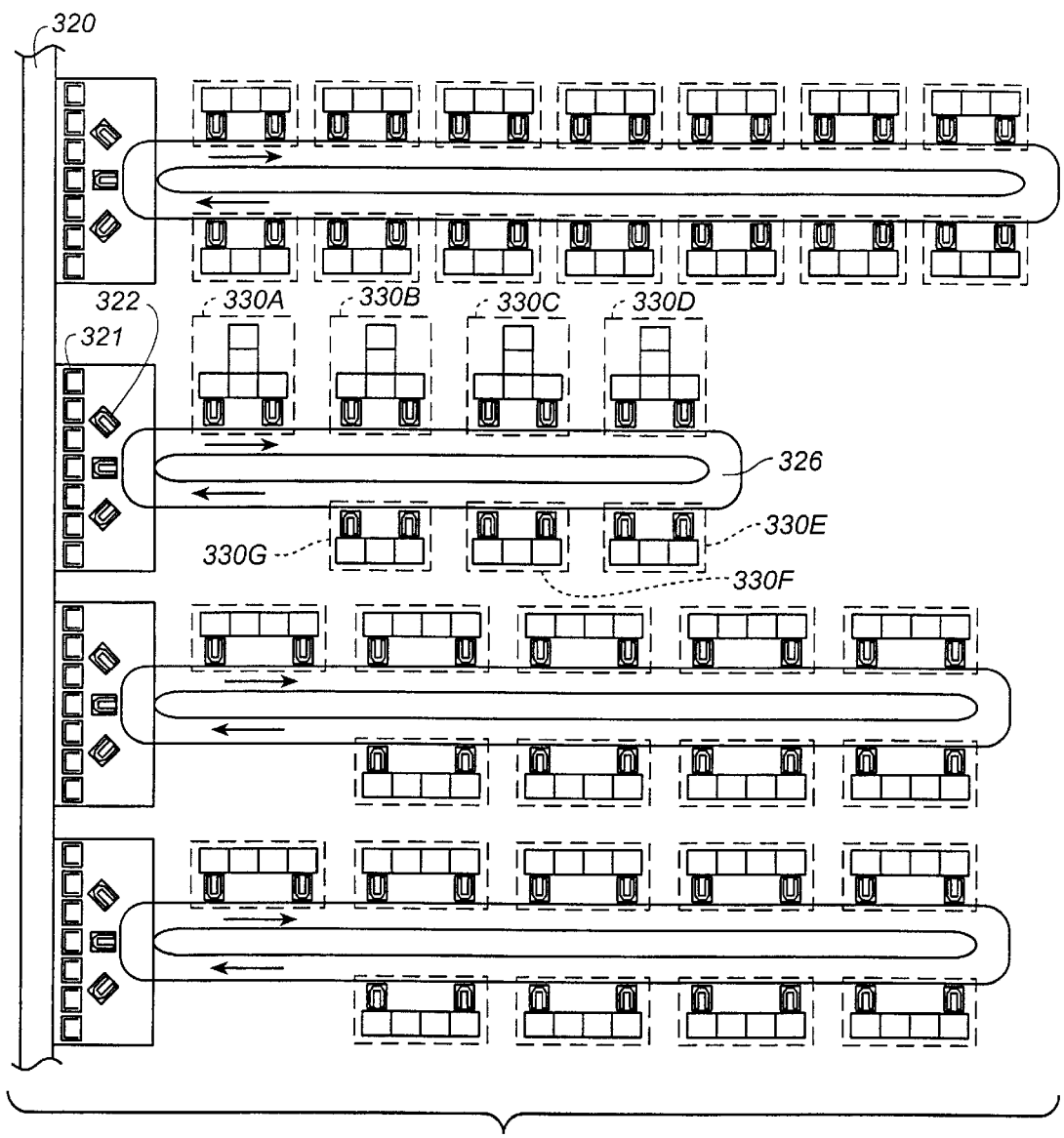
FIG._24

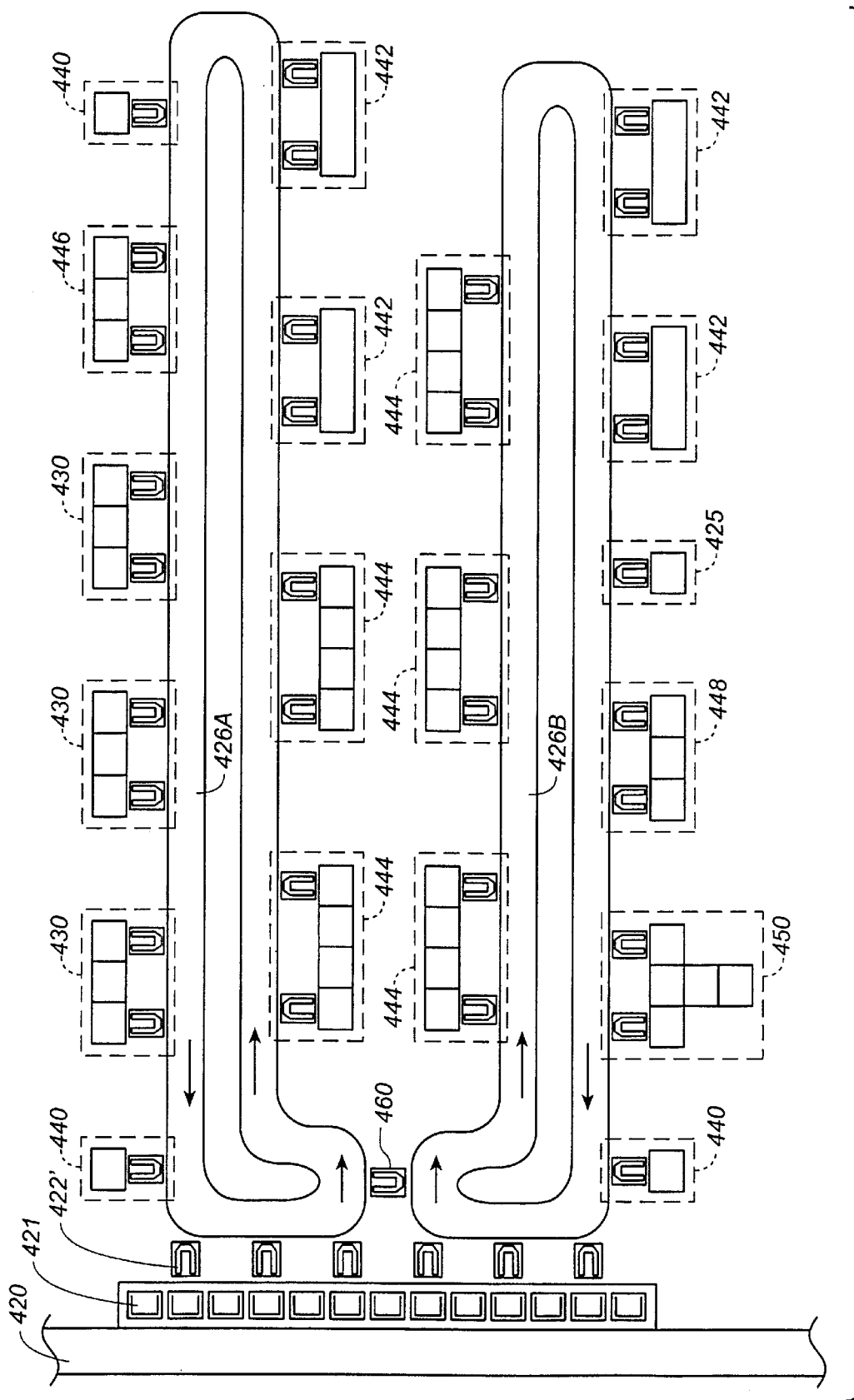
FIG._25

MODULAR SUBSTRATE PROCESSING SYSTEM

RELATED APPLICATIONS

This application is a continuation-in-part of U.S. patent application Ser. No. 08/946,922, entitled MODULAR CLUSTER PROCESSING SYSTEM, filed Oct. 8, 1997.

The present application is also related to the following U.S. patent applications which are being filed concurrently with this application: (1) "Method and Apparatus for Substrate Transfer and Processing"; (2) "Multi-Function Chamber For A Substrate Processing System,"; (3) "An Automated Substrate Processing System,"; (4) "Substrate Transfer Shuttle Having a Magnetic Drive,"; (5) "Substrate Transfer Shuttle,"; (6) "In-Situ Substrate Transfer Shuttle,"; and (7) "Isolation Valves".

The foregoing patent applications, which are assigned to the assignee of the present application, are incorporated herein by reference in their entirety.

BACKGROUND

The invention relates to substrate processing, and more particularly, to the handling of substrates in and around "processing islands", which may include just a processing chamber, a processing chamber with load locks, or a set of processing chambers with or without load locks.

Most semiconductor processes are automated. For example, automatic temperature controllers are used to heat a substrate to a predetermined temperature for a predetermined period of time as dictated by a process-control computer. Most processes are run by such a computer according to a "recipe" input by an operator.

One level of automation involves the loading and unloading of substrates. A cassette of typically 20 to 25 substrates is often used for such operations. Some process equipment employs a buffer storage capability for cassettes to increase efficiency by always having fresh substrates available for processing and a place to unload processed substrates. Automatic guided vehicles ("AGV"s) may also be used in this type of automation. AGVs travel along the aisles of a production line and dispense cassettes of substrates as required. This technique is useful for production lines in which the equipment is organized in rows. Besides AGVs, overhead rails may also be employed to transport cassettes of substrates.

Another level of automation employs sequential performance of specific processing steps. Such processing steps may involve separate processing machines or stations in an assembly line-like setting. "Clustering" combines two or more process steps in a single unit by using more than one process chamber surrounding a central loading chamber having a loading robot. Two or more sequential processes performed in a cluster system are referred to as "integrated processes". For example, a substrate may be placed in one process chamber for etching, a second process chamber for cleaning, and a third process chamber for metal deposition. Clustering also allows improved throughput by parallel processing multiple wafers in a single process step.

An improved cluster system is shown in FIG. 1. This system 20 includes a vacuum robot 22 in a chamber surrounded by processing chambers 24A–24D, load lock cooling chambers 26A and 26B, and heating chamber 28. The chambers 26A, 26B and 28 each contain a substrate cassette for holding a plurality of substrates. Substrates may be delivered to or removed from the chambers 26A and 26B. Specifically, the substrates may be exchanged for substrates in a plurality of cassettes 30 by an atmospheric exchange system 32.

The glass substrates can have dimensions, for example, of 550 mm by 650 mm. The trend is toward even larger substrate sizes, such as 650 mm by 830 mm and larger, to allow more displays to be formed on the substrate or to allow larger displays to be produced. The larger sizes place even greater demands on the capabilities of the processing systems.

To facilitate clustering, robotic systems have been used to transfer substrates from one processing station to another. Because of the high cost of robotics, including their associated controls and programming, one robot is often used to service a number of machines. Although such use is flexible, allowing accommodations to different or changing physical environments or processes, the robots are still expensive to acquire. They represent a single failure point which can affect an entire processing system. Although robots can be used to service a number of stations, they must service those stations sequentially, thus limiting the efficient use of the stations.

Yet another level of automation is providing for two or more sequential process steps in a single process chamber. This desirably eliminates an unloading and loading step, increasing cleanliness and throughput. For vacuum processes, time and cleanliness are favorably affected when more than one process can be performed with only one pump-down of a chamber.

Drawbacks of clustering include a greater reliance on interlocks, electronics, and software than is required for individual tools. Downtime also affects a larger part of the production capacity than is true for individual tools. In some cases, preferred cluster modules can only be supplied by different vendors, leading to difficulties in compatibility.

Even worse, the addition of a cluster tool in a factory requires a larger incremental factory size due to the floor space required for several process chambers. In other words, the minimum incremental factory size is larger for a cluster tool than for a single process chamber. Accordingly, cluster tools are currently arranged in a "job shop" configuration where all the process chambers perform the same or similar processes. Such a configuration is acceptable from a cost standpoint, but is practical only in large increments of factory capacity. A "mini-fab" factory configuration is not suitable for cluster tools because of the large incremental capacity of multi-chamber cluster tools.

A further drawback of cluster tools is a potentially inefficient matching of "TACT" times. The "TACT" time is the total actual cycle time and refers to the time period between the introduction of the substrate into the process system and its subsequent removal from the system. The TACT times of the various pieces of process equipment must substantially match in order for the factory to operate in an efficient serial sequence. As the mismatch in TACT times increases, the number of substrates required to keep the factory running likewise increases, along with the cost of operation. TACT times of cluster tools are less cost-effectively matched to one another, because cluster tools are purchased in larger per-system capacity increments.

SUMMARY

The invention provides an apparatus and method for performing a process on a substrate. At least two types of structures may be used to provide a flow path for a substrate so that the substrate may be moved from one processing or loading position to another. The first is a conveyor. The second is a track. The flow path may be a closed continuous loop.

In the conveyor system, a substrate transfer mechanism is provided to remove the substrate from the conveyor and to place another substrate on the conveyor. At least one processing island is adjacent the flow path. The conveyor may include a number of substrate holding elements such as pallets. The substrate transfer mechanism may be a robot having end effectors such as forks to lift, support, and move the substrate to and from the conveyor to the island.

Each processing island has at least one valve for introduction and extraction of the substrate into and out of an interior of the island. The processing island may include at least one and often two load locks, and may include in conjunction therewith an inspection station, a CVD chamber, a PECVD chamber, a PVD chamber, a post-anneal chamber, a cleaning chamber, a descumming chamber, an etch chamber, or a combination of such chambers. The load locks may be employed to heat and cool the substrates.

In the track system, a substrate exchange apparatus moves along a track to perform exchange of substrates from a substrate delivery and removal system to a processing island. The substrate delivery and removal system may include a number of cassettes to hold substrates and a number of automatic guided vehicles to deliver cassettes to and from a cassette loading system from which substrates may be retrieved by the substrate exchange apparatus.

In other aspects, several flow path conveyors may be provided, and a bypass robot may be employed to transfer substrates from one flow path to another.

Steps of the method include positioning a substrate on a conveyor, moving the substrate to a position adjacent a processing island load lock. The substrate is removed from the conveyor and introduced into the load lock. The substrate is moved from the load lock into the processing chamber and therein processed. The substrate is then moved into a load lock, which may be the same or a different load lock than the above load lock. The substrate is extracted from the load lock and placed on the conveyor. During the time of the above process, at least one other substrate is loaded onto the conveyor. The process may then be repeated any number of times.

Advantages of the invention include one or more of the following. The invention allows for small, cost-effective sizing of factory capacity. Factories employing the invention can be efficiently and cost-effectively configured in any of several manufacturing flow configurations, ie., job shop, ballroom, or mini-fab. The system allows for cost-effective matching of TACT time among some of the most expensive pieces of process equipment, including chemical vapor deposition (CVD), plasma-enhanced chemical vapor deposition (PECVD), etch, and photolithographic equipment. The invention allows for complete modularity in the design of fabrication processes. The chambers intended for use in the present invention may have the same or similar interfaces, allowing the same to be connected together in any combination whatsoever. In the present invention, if one processing island becomes fully or partially disabled due to malfunctions, etc., the system may continue to operate because the process may simply be reprogrammed to bypass the faulty island. The process of the disabled island may be reassigned to a different island while the disabled island is taken off-line and repaired.

BRIEF DESCRIPTION OF THE DRAWINGS

FIG. 1 is a top plan schematic view of a prior art cluster tool.

FIG. 2 is a top plan schematic view of a single aisle of a fab system according to the present invention.

FIG. 3 is a schematic longitudinal cross-sectional view of the aisle of FIG. 2.

FIGS. 4–8 are top plan schematic views of alternate tracked robot systems according to the present invention.

FIG. 9 is a top plan schematic view of an alternate system according to the present invention.

FIG. 10 is a perspective view of the system of FIG. 9.

FIGS. 11–17 are views of a robot end effector and conveyor substrate holding element in various relative orientations.

FIG. 18 is a top plan schematic view of an alternate system according to the present invention.

FIG. 19 is a perspective view of the conveyor system of FIG. 18.

FIG. 20 is a top plan schematic view of still another system according to the present invention.

FIG. 21 is a top plan view of a substrate transfer element according to the present invention.

FIG. 22 is a top plan view of an alternate embodiment of a substrate transfer element according to the present invention.

FIG. 23 is a top plan schematic view of a conveyor system according to an embodiment of the present invention, as it may be employed in a factory setting including numerous islands, most islands including a processing chamber and two load lock chambers.

FIG. 24 is a top plan schematic view of a multiple conveyor system according to the present invention as fed by a single AGV aisle.

FIG. 25 is a top plan schematic view of a two conveyor system according to the present invention, fed by a single AGV aisle and linked by a conveyor-to-conveyor transfer robot.

Like reference numbers and designations in the various drawings indicate like elements.

DETAILED DESCRIPTION

FIG. 2 shows an aisle 40 of a fabrication system according to the present invention. The aisle includes first through fourth islands 42A–42D, respectively, on opposite sides of a track 44. The track has first (proximal) and second (distal) ends 46 and 48, respectively. Each island includes a load lock chamber 50, often used for heating, a load lock chamber 52, often used for cooling, and at least one processing chamber 54.

The load locks allow a staged vacuum to occur. That is, the process chamber vacuum need not be breached for substrates to be loaded and unloaded. Since the load locks are independently evacuated, pumps servicing the process chamber need only pump on a chamber (i.e., either of the load locks) that is already at a vacuum. That is, a substrate is loaded into the load locks which are then pumped down to a vacuum. A valve or set of valves between the load lock and the processing chamber is opened to allow transfer of the substrate between the two. When this happens, the processing chamber is subjected to the vacuum of the load lock. Had the vacuum not been staged, i.e., had the load lock not been pumped down, the exposure of the process chamber to such a pressure could lead to contamination of the process chamber. Such a capability is particularly important for, e.g., plasma vapor deposition (PVD), which may often require the lowest pressure of any process.

The processing chamber 54 is in controlled communication with the load lock chambers by means of gate or slit valves 56 and 58, respectively, at the entrance and exit of the processing chamber. At the first end 46 of the track 44 is a bulk substrate delivery and removal system which, in the illustrated embodiment, is formed as an automatic cassette loading system ("ACLS") 60. AGVs 62 which move along an AGV aisle 66 are provided to deliver substrate cassettes to and remove substrate cassettes from ACLS 60. The ACLS includes an inboard cassette holding fixture 68A, and outboard cassette holding fixtures 68B and 68C positioned at first and second sides of the inboard cassette holding fixture 68A. The inboard holding fixture 68A is fixed in a position adjacent the AGV aisle. The cassettes each have features for holding a vertical array of substrates in a parallel spaced-apart relation. The outboard holding fixtures 68B and 68C are movable (via translation and rotation) between the initial or cassette exchange positions (shown in broken lines) adjacent the AGV aisle 66 for exchanging cassettes with AGVs 62 and second or substrate exchange positions (shown in solid lines) for exchanging individual substrates in their cassettes with a substrate exchange robot 70. In the illustrated embodiment, the robot is an "atmospheric" robot, operating in the atmosphere of the factory, at substantially ambient pressure.

The robot 70 (described in further detail below) is movable along the track 44 between the first and second ends 46 and 48. When located in a first position at the first end 46, the robot 70 can retrieve and return substrates to and from the cassettes on holding fixtures 68A–68C. With the robot 70 in the first position, the inboard holding fixture 68A and the outboard holding fixtures 68B and 68C, when in their second positions, each face the robot to facilitate exchange of substrates with the robot. The robot may be moved to a plurality of positions along the track where it may exchange substrates with the process islands. In a first loading position, shown in broken lines and designated with the numeral 70', the robot may load a substrate 72 into the entry load lock chamber 50 of the first island 42A through a gate or slit valve 74. In the same position, but in an orientation rotated 180° therefrom about a vertical axis, the robot may load a substrate into the entry load lock of island 42B. Another such loading or insertion position and pair of loading orientations are associated with the loading chambers of islands 42C and 42D. Similarly, an unloading or extraction position and a pair of unloading orientations are associated with each opposite pair of islands 42A and 42B, and 42C and 42D. The robot, shown in broken lines and designated with the numeral 70", is in the unloading position for the islands 42C and 42D, and in the unloading orientation specifically for the island 42D where the robot can extract a substrate through a gate valve 76 on exit load lock or unloading chamber 52.

A clean tunnel 80, also shown in cross-section in FIG. 3, encompasses the track 44 and ACLS 60 and may extend over a portion of AGV aisle 66. The clean tunnel extends to the load lock chambers of the various islands and provides a clean environment through which the robot may transport substrates between the islands and the ACLS. All along its roof, the clean tunnel may have filtered fans 82 (FIG. 3) for introducing clean air into the clean tunnel to maintain the clean tunnel at a slight positive pressure, thereby preventing entry of unwanted contaminant particles through various tunnel openings.

Referring back to FIG. 2, the track 44 extends through the distal end of the clean tunnel 80. A sufficient length of track is provided between the end of the clean tunnel and the distal end 48 of the track to provide a service/maintenance position for the robot, shown in broken lines and designated 70'''. With the robot in the service/maintenance position at the distal end 48 of the track, technicians have substantially unimpeded access to the robot and can perform service on the robot including cleaning or replacement of robot end effector.

This modular design allows the track (which may also be a conveyor as described below) to be of any length desired and to accommodate any number of processing islands to achieve a desired process. Advantageously, as shown in FIG. 2, the conveyor or the track may be made of identical modular track segments 71 which may be coupled together to extend the conveyor or track any desired distance. The coupling mechanisms may vary.

As shown in FIG. 3, the track 44 is securely mounted to the facility floor 99. The robot is coupled to the track so as to be movable along the length of the track, but substantially immovable transverse to the track and not rotatable about the length of the track so as to prevent the robot from tipping over. The robot includes a base 84 having a central vertical axis 86 and a body 88 extending upward from the base 84. The body may be rotated about the axis 86 by a rotary actuator (not shown). An end effector, in the form of a lifting fork 90, is coupled to the body by an arm 92. At its proximal end, the arm 92 is coupled to a vertical linear actuator (not shown) to permit the arm and lifting fork to be raised and lowered. Optionally, as shown in FIG. 2, the robot may have a pair of arms 92A and 92B each with an end effector 90A and 90B, respectively. Such a configuration allows greater speed and flexibility in the operation of the robot as may be dictated by the process requirements. Referring to FIG. 2, in a lowered position, the fork 90 may be inserted beneath a substrate 72 in a cassette or in a load lock chamber. When raised to an intermediate position, the upper surface of the fork or, more particularly, pads (not shown) along the upper surface of the fork tines, engage the lower surface of the substrate. When further elevated to a raised position, the fork lifts the substrate out of engagement with the cassette or load lock chamber. With respect to a cassette, if the vertical range of the robot actuator is insufficient to address each location along the height of a cassette, the cassette holding fixtures may include elevators, capable of raising and lowering their associated cassettes to facilitate access by the robot. Alternatively, the robot end effector may be made to move primarily horizontally such that the elevators provide most of the vertical translation. The arm 92A may be articulated to reciprocate the fork 90A along its central axis 94 (FIG. 2) between extended and retracted positions to insert and extract a substrate, respectively. A largely extended position is shown in FIG. 2 for arm 92A, and a largely retracted position is shown in arm 92B of the robot in position 70". With the fork in the largely retracted position, the substrate is substantially centered over the track in a relatively compact configuration so that the robot may move along the track carrying the substrate without colliding with adjacent structures.

It can be seen how, via rotation of the body 88, the robot can be made to align the fork 90A (and its axis 94), for example, with the longitudinal axis of the cassette holding fixture 68A or the outboard fixtures 68B and 68C when the latter fixtures are in their substrate exchange positions. Such rotation can further be used to alternate the robot between addressing load lock chambers on one side of the track and load lock chambers on the other side of the track.

Other bulk substrate delivery and removable systems such as belt or pallet type conveyors may be used in place of the AGV/ACLS system. Furthermore, multiple aisles 40 are preferably associated with a single AGV aisle 66 or conveyor system to maximize fab efficiency.

FIG. 4 shows a system having an aisle 510 which may be otherwise similar to aisle 40. Rather than having an AGV/ACLS substrate delivery and removal system, the aisle has a conveyor system 512 which, in the illustrated embodiment, comprises frame-type substrate holding elements 514 as will be described in greater detail below. A robot 516 may exchange a substrate with a particular frame which, at a given point in time, is located at the proximal end of the track 518 which is positioned perpendicular to the conveyor. The robot may move along the track and interact with the islands as has been previously described with reference to robot 70. Specifically, these islands include load lock chambers 501 and 507, process chambers 503 and 508, and load lock chambers 505 and 509.

FIG. 5 shows a robot 520 which is movable along a track 522 alongside and parallel to the conveyor. The robot 520 can exchange substrates with substrate holding elements of the conveyor at plural locations along the conveyor adjacent to the track 522. These locations include those corresponding to a load lock chamber 515, a process chamber 513, and a load lock chamber 511.

FIG. 6 shows a system similar to that of FIG. 5. In this embodiment, the conveyor is replaced with an ACLS system 533. The ACLS system can exchange substrates at various locations including at a load lock chamber 517, a process chamber 519, and a load lock chamber 521.

FIG. 7 shows a system having a conveyor, robot, and track similar to that of FIG. 5 but with an optional island configuration. In this embodiment, load locks 530 and 532, respectively, are provided adjacent the track to exchange substrates with the robot. A low pressure heating chamber 534 is located at the rear of the heating load lock 530 and a transfer chamber 536 is located near the back of the cooling load lock 532. A first processing chamber 538 is positioned between the low pressure heating chamber 534 and the transfer chamber 536. A second processing chamber 540 is positioned at the outboard side of the transfer chamber 536.

FIG. 8 shows a system similar to that of FIG. 7 but wherein the conveyor is replaced by an ACLS 535. This system includes load locks 523 and 537, process chambers 525 and 529, a separate heating chamber 531, and a transfer chamber 527.

Referring to FIG. 9, in a further embodiment, an island 120 is provided for processing. The island 120 includes a process chamber 123, and associated load lock heating chamber 121 and load lock cooling chamber 125. The island 120 may be otherwise similar to those of the embodiment of FIG. 2. A conveyor 131 transports substrates to and from the island 120. The sources and destinations of the substrates may include other processing islands which, in combination with island 120, perform sequential treatment processes on the substrates. For example, the conveyor 131 delivers substrates to heating chamber 121 and receives substrates from cooling chamber 125 via an atmospheric loading robot 128A having an end effector 129A and an atmospheric unloading robot 128B having an end effector 129B, respectively. As illustrated in FIG. 9, an unprocessed substrate 127 may be loaded into heating chamber 121 by the loading end effector 129A and a processed substrate 127' may be removed from cooling chamber 125 by the unloading end effector 129B. Process chamber 123 may be, for example, a chemical vapor deposition (CVD) chamber, a physical vapor deposition (PVD) chamber such as for deposition of indium tin oxide (ITO), an etch chamber, a PECVD chamber, or other such semiconductor vacuum processing chambers as are known in the art.

Each load lock chamber may be multifunctional. Process steps including heating, cooling, ashing, descumming, etc., may be provided for and employed in each load lock. Typically, the load lock 121 may be used to heat and descum, while the load lock 125 may be used to cool and ash. If an ash step is employed, this requires a separate heating capability, necessitating a multi-functional load lock. Heating processes in such multifunctional load locks may include post-process anneals. Non-heating or cooling processes which may occur in a multifunctional load lock include inspections under either vacuum or atmospheric conditions. Such functions and structure are described in the application "Multi-Function Lock Chamber for a Substrate Processing System", incorporated by reference above.

Referring to FIG. 10, which shows a perspective view of the island of FIG. 9, various other components are evident. Loading end effector 129A is shown positioned exterior to load lock heating chamber 121. When loading a substrate 127 into heating chamber 121, the end effector 129A enters heating chamber 121 via a loading slit or gate valve 132. The substrate is received by a substrate transport structure (not shown) interior of heating chamber 121, and is maneuvered into a desired position for heating. Once processing (which may include a pumpdown to vacuum to correspond to a vacuum in the processing chamber, as well as a heating step) is completed within heating chamber 121, the substrate is moved into process chamber 123 via a transporter or shuttle (not shown) which moves the substrate through a first transfer valve 134 between heating chamber 121 and process chamber 123. Once the substrate is in process chamber 123, the transport structure extracted and the valve closed, processing may be commenced. In FIG. 10, a factory worker 100 is shown. The worker, the substrates, and the transfer mechanisms are protected against collision with each other by a set of machine guards 136. Following processing, the substrate is moved into cooling chamber 125 (which may also have been pumped down to vacuum) via the same or a second substrate transporter (not shown) through a second transfer valve 138. Cooling or other such processing may then be commenced. Once the cooling or other processing is complete, the processed substrate (shown as 127') is removed from cooling chamber 125 via unloading slit valve 140 and end effector 129B.

Prior to the substrate's introduction into the load lock heating chamber 121, the substrate may have been transported down conveyor 131 from a storage location as described below. The conveyor system may be any suitable powered or gravity-operated type, including, for example, roller and linked belt conveyors. The substrates may be moved on a series of discrete substrate holding elements, including first, second and third elements 142A–142C (collectively 142). Substrates may be centered on the substrate holding elements using a plurality of stoppers 201 (only shown in connection with element 142A). These stoppers 201 may have the general shape of an inverted truncated cone, such as a frustum. The substrate holding elements 142 may be continuously arrayed along the length of the conveyor, and may be evenly and fixedly spaced relative to each other or may be independently controllable to allow temporary interruptions in the movement of individual elements. The substrates move on the elements in a downstream direction (here denoted as the x-direction 200)

along a work flow path defined by the conveyor. Chambers 121, 123 and 125 are located adjacent the work flow path. The directions orthogonal to the downstream direction 200 are designated as a horizontal or y-direction 201 (between the conveyor and the chambers) and a vertical upward or z-direction 202.

For a given processing chamber to perform an operation on a particular substrate, the substrate's movement is stopped adjacent the loading robot 128A. This may be done by stopping a substrate holding element in the location of element 142A in FIG. 10. As shown in FIG. 11, the stopped position is adjacent to the chamber 121 and directly over loading end effector 129A which has been previously appropriately withdrawn (FIG. 12) from the chamber 121 by a y-linear actuator 143A (FIG. 10), lowered along the z-direction by a z-linear actuator 144A (FIG. 10), and rotated about the z-direction (compare FIGS. 12 and 13) by a z-rotary actuator 146A (FIG. 10). Loading end effector 129A is then raised by z-linear actuator 144A to engage and cradle the substrate (FIG. 14). Loading end effector 129A is further raised to lift the substrate into an elevated position (FIG. 15) wherein loading end effector 129A holds the substrate above the element 142A.

The z-rotary actuator 146A of robot 128A is then caused to rotate the loading end effector 129A 180° (FIG. 16) so that the substrate may be introduced into load lock heating chamber 121. Fine adjustments may be made by zlinear actuator 144A to adjust the height of the substrate so that the substrate may enter loading slit valve 132 unimpeded. When the proper height is achieved, the loading slit valve 132 is opened and the substrate is moved by y-linear actuator 143A in the y-direction (FIG. 17). This movement loads the substrate into load lock chamber 121 where it is received by a substrate transport structure (not shown). The empty end effector 129A may then be withdrawn from the chamber 121. Loading slit valve 132 is then closed and the heating and evacuation process begun. After processing, with the substrate in load lock chamber 125, the substrate may be returned to the conveyor by essentially reversing these steps with an unloading slit valve 140, the unloading end effector 129B, a y-linear actuator 143B, a z-linear actuator 144B, a z-rotary actuator 146B and a conveyor element in the position of third element 142C.

It should be noted that loading end effector 129A engages the substrate held on substrate holding fixture 158 in the same way that the loading end effector 129A engages a substrate held on a substrate holding cassette. Such cassettes are known and are disclosed, e.g., in U.S. Pat. No. 5,674,786, entitled "Method of Heating and Cooling Large Area Glass Substrates", to Turner, White and Berkstresser, issued Oct. 7, 1997 and U.S. Pat. No. 5,607,009, entitled "Method of Heating and Cooling Large Area Substrates and Apparatus Therefor", to Turner, White and Berkstresser, incorporated herein by reference in their entirety. As shown, the loading end effector 129A may have the shape of a fork, and may in particular have the shape of a forked blade. By using a loading end effector 129A of this design, a bridge is made to older manufacturing lines which then may more easily and cost-effectively integrate the system of the present invention.

FIG. 18 shows an island 120' employing two process chambers 123A and 123B which may be used to process a substrate. In a fashion similar to island 120 of FIG. 9, island 120' employs a load lock chamber 121 for introduction of substrates into the system. The island also employs a load lock chamber 125 for extraction of substrates out of the system. The introduction of a substrate is made via a loading end effector 129A'. The extraction of a processed substrate is made via an unloading end effector 129B'. A system such as is shown in FIG. 18 may be used to deposit two films on a substrate by first depositing a film layer on the substrate in the first process chamber 123A and then moving the substrate into the second process chamber 123B where a second film layer may be grown or deposited.

The remainder of the island system, including the movement of the substrates along conveyor 131, is similar to that described with respect to FIGS. 9 and 10. The island 120' is also shown in perspective view in FIG. 19. As shown, the loading end effector 129A', like end effector 129A, may enter a loading slit valve carrying a substrate. Loading end effector 129A' is similarly supported by a z-linear actuator, a z-rotary actuator, and a y-linear actuator. The system for extraction of a substrate includes an unloading end effector 129B', a z-linear actuator, a z-rotary actuator, and y-linear actuator. In a similar fashion to that described above, the substrate is extracted from the load lock chamber 125 through an unloading slit valve.

FIG. 19 also shows a series of first, second, third, and fourth substrate holding elements formed as conveyor pallets 142A'–142D'. These pallets (collectively 142') are discussed below and compared relative to the frame-type holding elements 142 of FIG. 10. Also shown in FIG. 19 is a laminar flow hood 150 which performs a similar function as the clean tunnel 80 described above.

FIG. 20 shows an island 120" that may be used for the deposition of a three-layer film on a substrate. It should be noted that, in all of these embodiments, a greater or fewer number of film layers may be grown than is described. For example, substrates may be shuttled back and forth between process chambers by way of appropriate programming of the substrate transporter(s) within the system. Such substrate transporters are described in the application "Substrate Transfer Shuttle", incorporated by reference above. Alternatively, more than one film may be sequentially grown in a single process chamber. Also, a substrate may be passed through a process chamber without any film being grown or any processing performed.

The operation of island 120" is otherwise similar to that of island 120. The substrate may be moved from load lock heating chamber 121 into a transfer chamber 122. From transfer chamber 122, the substrate may be moved into a first process chamber 123C for film deposition or other processing as a first step. The substrate may then be moved into a second process chamber 123D for growth or processing as a second step. The substrate may then be moved back into first process chamber 123C for deposition or processing as a third step. Following these three steps, which may be repeated as described above, the substrate is moved back into transfer chamber 122 and finally into load lock chamber 125. From load lock cooling chamber 125, the processed substrate may be removed from the system.

The design of the conveyor substrate holding elements and robot end effectors may vary. Returning to FIG. 10, each conveyor substrate holding element 142 may be formed as a generally C-shaped structure having, and supported by, a lower arm 152 which engages a track element 154 of the conveyor 131. The arm 152 extends generally transverse to the substrate work flow path. At the distal end of the arm 152, an upright 156 extends vertically upward and joins a substrate holding fixture 158 which forms the top of the C-shaped structure. With further reference to FIG. 16, the fixture 158 has a peripheral frame section 160 which is configured to extend alongside opposite edges of a substrate 127 and to wrap partially around the end of the substrate, leaving a gap 162 which defines an open distal end of the fixture. The fixture has a central aperture 164 which is generally co-extensive with and slightly larger than the substrate 127. When the substrate is held by the fixture 158 (FIG. 12) the underside of the substrate is supported by a plurality of fingers 166 which project inwardly from frame 160. The fingers have upper surfaces which are slightly vertically recessed from the upper surface of frame 160 so that the substrate 127 may be securely held in precise registration with the fixture, the edges and ends of the substrate constrained by the inward-facing surfaces 163 of the frame 160. Advantageously, the fingers are sufficiently long and extend sufficiently into the aperture 164 so as to provide a necessary degree of support for a relatively thin and flexible substrate 127. Furthermore, the fingers are sufficiently narrow so that, should a substrate break, its various pieces will fall through the spaces between the fingers, without leaving any shards or other debris on top of the fingers so as to interfere with processing of subsequent substrates.

End effector 129A is generally formed as a forked blade, the degree to which the blade is forked being determined by the system requirements, particularly in terms of reducing weight. The end effector is sized so as to pass vertically through central aperture 164 of the fixture 158 without interfering with the frame 160 or fingers 166. At the distal end of the end effector, a pair of upwardly projecting tabs 168 serve as stops to engage the end of the substrate and prevent the substrate from sliding off the distal end of the end effector during movement. A notch 170 may be provided in the fixture 158 at the proximal end of the aperture 164 to permit passage of the tabs 168 during exchange of the substrate between the fixture 158 and the end effector 129A.

FIGS. 19 and 21 show an embodiment of the end effector 129A' as a substrate transfer frame. The substrate transfer frames 129A' and 129B' are in many ways similar to fixture 158 and employ a peripheral frame member 270 having an open distal end and from which a plurality of substrate support tabs 177 project inwardly into a central aperture 179. Substrate 127, shown in dotted lines, is supported by the substrate support tabs 177. The aperture area of frame member 270 is made just larger than the area of the substrate so that the substrate fits within the frame member and is cradled by the substrate support tabs 177. The frame member is coupled to the z-linear actuator by a connection 174. With further reference to the pallet configuration shown in FIG. 19, the central aperture within the frame member 170 is slightly larger than the plan area of each of a plurality of pallets 158'. As the frame member is raised from below a pallet, the tabs pass through inwardly directed notches or recesses 161 in the pallet perimeter so that the upper surfaces of the tabs can engage the lower surface of the substrate 127 adjacent the substrate perimeter. The frame may be further raised to lift the substrate into an elevated position above the pallet. In a way similar to that of stoppers 201 in the embodiment of FIG. 10, a plurality of stoppers 301 may be employed to hold the substrate 127 on frame member 270. Like stoppers 201, stoppers 301 may have the general shape of an inverted truncated cone, such as a frustum.

It is further noted that pallets 158' may include stoppers to position and hold a substrate on the pallets 158' (not shown). Of course, such stoppers are configured such that they do not impede the movement of frame members 170 around the outside of the pallets 158' during substrate transfer. Furthermore, substrates on pallets 158' may be supported by friction pads 401 such as plastic buttons. In this way, substrates may endure less stress than if they were supported directly on the pallets. Such stoppers or pads may also be used on systems employing forked blade conveyor elements.

FIG. 22 shows another embodiment of an end effector formed as a substrate transfer fork 180. In particular, a substrate 127 is shown in dotted lines supported by the tines 182 of the substrate transfer fork 180. Such a fork may be useful where the conveyor has narrow pallets around which the tines of the fork may pass or where the conveyor supports the substrates along their edges such that the fork can pass between the support locations. In the latter case, the fork may be replaced by a blade. Substrate transfer fork 180 is mounted to supporting z-linear actuator via a connection 184.

FIG. 23 shows how multiple islands may be employed in a "job shop" configuration. In FIG. 23, substrates are moved by AGVs along an AGV aisle 220 and into a plurality of substrate stackers 221. From substrate stackers 221, substrates are moved into the conveyor system via a conveyor loader 222. Substrates are moved out of the system via a conveyor unloader 224. When substrates are moved into the system, they are placed on conveyor pallets 158 carried by a conveyor 226 which may be an endless loop discrete holding element conveyor similar to the conveyors described above. Any number of islands may be employed along the conveyor.

When the system shown in FIG. 23 is used for CVD, islands 230A–230J may be specifically for the growth of the active layers of thin film transistors (TFTs), and islands 230K–230N may be specifically for the growth of passivation layers. Thus, in this system, each process chamber assigned to the active-layers (islands 230A–230J) would be employed to deposit multiple layers sequentially. Passivation islands 230K–230N could be used to deposit a passivation layer as a final step over the TFT. As illustrated, the greater number of TFT islands may be provided to balance a longer processing time required by the active-layer islands relative to the passivation islands. Appropriate control of the conveyor, the robots of each island, the loader and unloader and other elements of the system via a specifically programmed computer can choreograph the movement of substrates to and from the conveyor and between active-layer and passivation islands to maximize throughput. This is a good example of small, incremental TACT time balancing.

One type of function which may also be employed is a substrate buffer station 235. Such a buffer 235 may be placed, for example, upstream of an island for the purpose of holding substrates prior to their processing. The buffer station 235 provides a location where substrates may be temporarily stored. For example, if an island is occasionally called upon to perform a time-intensive process or requires operator assistance or service, substrates may be stored in a buffer 235 near the island so that substrates will be immediately available when the island is ready to process the next substrate. Buffer chambers may also be employed upstream of each one of a number of islands to even further facilitate rapid processing. Such buffer stations may have a number of shelves on which substrates are located and, if desired, heated or cooled.

Referring to FIG. 24, the invention is shown employed within a PVD job shop configuration. As above, an AGV aisle 320 is used to move substrates into a plurality of substrate stackers 321. Substrate stackers 321 feed substrates to a plurality of conveyor loader/unloaders 322. Loader/unloaders 322 move substrates to and extract substrates from conveyors 326. Conveyors 326 move substrates to selected ones of islands. As an example, again for the growth of TFTs, islands 330A and 330B may be used to deposit sources and drains. In doing so, these dual process chamber islands may deposit three layers of titanium/aluminum/titanium. Islands 330C and 330D may be used to grow gate layers such as titanium/aluminum. In using dual process chamber islands 330C and 330D to grow two layers, one of the process chambers may be dormant in one step as mentioned above. Finally, islands 330E–330G may be used to deposit the pixel layer, such as to deposit ITO above the TFT. FIG. 24 also shows multiple conveyors being fed by a single AGV aisle. The conveyors deliver substrates to and receive substrates from processing islands in a variety of configurations. These systems of FIGS. 23 and 24, as well as similar systems, have a number of advantages over known systems. First, a variable number of process chambers can be cost-effectively implemented. This allows for incrementing factory capacity in small amounts. TACT time balancing may also be easily facilitated. Second, the conveyor track may be of variable length and may be kept clean in a more simple manner than AGVs that link separate tools. Third, the cyclical layout of the system allows substrates to automatically return to the same cassette from which they were unloaded without need for additional effort or mechanisms. Finally, it is relatively easy to implement inspection and/or test stations along the conveyor route. Such inspection test stations may be employed for process monitoring, counting particulates, or for implementing "go/no go" decisions.

FIG. 25 shows an embodiment of a system, often termed the "mini-fab configuration", wherein a pair of adjacent first and second conveyors 426A and 426B are fed by the single AGV aisle 420. The first and second conveyors each have one or more robot-fed inspection test stations 440. The substrates are delivered to and removed from the conveyors by stackers 421 and loader/unloaders 422 as have been previously described. Of particular note is the inclusion of a conveyor-to-conveyor transfer robot 460 which can transfer or bypass substrates directly between the conveyors so that processes may be sequentially performed on a given substrate by islands of the adjacent conveyors without having to return the given substrate to the bulk substrate delivery and removal system. To facilitate this, the conveyors may be positioned substantially adjacent to each other at the conveyor-to-conveyor transfer robot 460. The transfer robot may be otherwise similar to the loaders used with the processing islands. Furthermore, an intraconveyor transfer or bypass robot (not shown) may be provided in the interior of a conveyor. The intraconveyor transfer robot transfers substrates between two remote locations on a single conveyor. The intraconveyor transfer robot may be used for a variety of purposes including the reordering of substrates along the flow path, the stabilization of substrate flow along the conveyor, the avoidance of "log jam", or for other process purposes.

In varying combinations the conveyors may deliver substrates to and remove substrates from CVD process islands 430, substrate cleaning islands 442, etch/ash islands 444, CVD passivation island 446, and PVD process islands 448 and 450. Systems, such as shown in FIG. 25, allow the mixing of various chamber types along the conveyor route to achieve wide flexibility in design. In this way, widely varying processes may be implemented to allow the growth of numerous types of films and devices. This is possible because the system maintains a substantially uniform pitch regardless of the number of process chambers configured together in a single island.

Referring back to the illustrated embodiment of FIG. 23, a number of substrate holding elements 158 are shown on a continuous conveyor substrate handling system. In this preferred embodiment, all holding elements 158 index forward from one stop position to the next stop position simultaneously. As can be seen, the substrate holding elements are spaced such that when one is servicing a load lock of processing island 230B, another can be servicing the corresponding load lock of processing island 230C. In this way, a substatially uniform pitch (i.e., the centerline-to-centerline distance between adjacent chambers) is maintained and TACT time is optimized. This is especially important in a conveyor system where multiple substrates and processing islands must be appropriately indexed so that loads and unloads occur substantially simutaneously at all desired load lock positions. Further, the distance between an entrance or first load lock and processing chamber may be substantially equal to the pitch between substrate holding elements 158. Of course, because some processing islands may have more or less than three chambers in total, it would suffice to have the pitch of the load locks not be exactly the same, but rather a multiple of the pitch of the substrate holding elements. In other words, the pitch between adjacent chambers (P1), whether load lock or processing, should be substantially the same or an integar multiple of the pitch between adjacent substrate holding elements 158. In a preferred embodiment, P1 is approximately equal to P2. Furthermore, the pitch may preferably be uniform between different processing islands, even if the processing islands perform different processes, e.g., PVD, CVD, etch, etc. Thus, typically, at a given moment in time while the conveyor is stopped substrate holding fixes are substantially aligned in front of all substrate transfer mechanisms.

For further modularity, each chamber, whether a load lock, a processing chamber, a vacuum or atmospheric inspection station, etc., may employ identical or similar structural connections and interfaces. As such, any combination of chambers may be structurally combined and attached together.

It is possible to envision conveyor systems which have independently movable pallets or forks to hold the substrates and therefore would not require a substantially uniform pitch.

However, these kind of transport systems are more complex, less reliable and therefore somewhat less desirable.

Various functions and their associated structures may be combined or further divided from those illustrated herein. For example, while etch/ash chambers have been disclosed, a descum chamber 425 may also be advantageously included to, e.g., remove undissolved pieces of resist or dried developer left on the surface of films (see FIG. 25). Such chambers may employ oxygen-rich plasmas to accomplish descumming. A variety of substrate transfer or holding moieties may be used in appropriate combinations including the illustrated frames, forks and pallets. Accordingly, other embodiments are within the scope of the following claims.

A number of embodiments of the present invention have been described. Nevertheless, it will be understood that various modifications may be made without departing from the spirit and scope of the invention. Various other types of process equipment, e.g., those involved in photolithographic techniques, may be combined into systems other than those specifically shown.

What is claimed is:

1. An apparatus for performing a process on a substrate, comprising:
   a conveyor to support the substrate along a flow path;
   a substrate transfer mechanism configured and arranged to remove the substrate from and place another substrate on said conveyor, and
   at least one processing island located adjacent to said flow path, said processing island comprising a load lock chamber and a processing chamber and having a valve for introduction and extraction of the substrate into and out of an interior thereof.

2. The apparatus of claim 1, wherein said processing island is an inspection station for inspection of the substrate.

3. The apparatus of claim 1, wherein said processing chamber is separated from the conveyor by the load lock chamber.

4. The apparatus of claim 1, wherein said load lock chamber is a heating or cooling chamber.

5. The apparatus of claim 1, wherein said processing chamber includes one or more chambers configured to perform at least one process, or a combination of processes, selected from a group of a CVD process, a PECVD process, an etching process, a cleaning process, a descumming process, a PVD process, and a post-anneal process.

6. The apparatus of claim 3, wherein said processing island includes two processing chambers.

7. The apparatus of claim 1, wherein said conveyor includes a plurality of substrate holding elements.

8. The apparatus of claim 1, further including at least one substrate stacker to hold substrates prior to or after processing.

9. The apparatus of claim 1, wherein said substrate transfer mechanism includes an end effector for supporting the substrate, a horizontal linear actuator for horizontally translating the end effector, and a vertical linear actuator for vertically translating the end effector.

10. The apparatus of claim 9, wherein the end effector is fork-shaped.

11. The apparatus of claim 9, wherein said substrate transfer mechanism includes a vertical rotary actuator for rotating the end effector about a vertical axis.

12. The apparatus of claim 1, wherein said substrate transfer mechanism is moveable from a position directly below the substrate on said conveyor when the substrate is in a stopped position adjacent said processing island, to a position engaging the substrate, and then to a final position wherein the substrate is positioned above the conveyor.

13. The apparatus of claim 1, wherein said processing island includes an entry load lock chamber, a processing chamber and an exit load lock chamber.

14. The apparatus of claim 13, wherein said entry load lock chamber is a heating chamber and said exit load lock chamber is a cooling chamber.

15. An apparatus for performing a thin film process on a substrate, comprising:
   a conveyor to support one or more substrates;
   a plurality of processing islands located adjacent the conveyor, each processing island comprising:
      a first load lock chamber having a first valve for introduction of a substrate therein;
      a processing chamber in communication with said first load lock chamber; and
      a second load lock chamber in communication with said processing chamber and having a second valve for extraction of a substrate therefrom; and
   a substrate exchange apparatus configured and arranged to retrieve a substrate from the conveyor, introduce the substrate into an interior of a selected processing island, extract the substrate from the interior of the selected processing island, and replace the substrate on the conveyor.

16. The apparatus of claim 15, wherein at least one of the processing chambers is separated from the conveyor by at least one of the load lock chambers.

17. The apparatus of claim 15, wherein said first load lock chamber is a heating chamber and said second load lock chamber is a cooling chamber.

18. The apparatus of claim 15, wherein the substrate exchange apparatus includes:
   a first robot for retrieving the substrate from the conveyor and introducing the substrate into the interior of the selected processing island; and
   a second robot for extracting the substrate from the interior of the selected processing island and positioning the substrate on the conveyor.

19. The apparatus of claim 15, wherein the substrate exchange apparatus includes:
   a loader having an end effector for retrieving the substrate from the conveyor and introducing the substrate into the interior of the selected processing island; and
   an unloader having an end effector for extracting the substrate from the interior of the selected processing island and positioning the substrate on the conveyor.

20. The apparatus of claim 19, wherein the end effector has the shape of a fork.

21. The apparatus of claim 15, wherein the conveyor forms a continuous loop.

22. The apparatus of claim 15, wherein the conveyor has a plurality of individual holding elements, each for holding a substrate.

23. The apparatus of claim 22, wherein the pitch between adjacent individual holding elements and the pitch between adjacent chambers in a processing island is substantially uniform.

24. The apparatus of claim 23, wherein the pitch between adjacent individual holding elements is substantially equal to the pitch between adjacent chambers in each of said plurality of processing islands.

25. The apparatus of claim 23, wherein the pitch between adjacent individual holding elements is substantially equal to the pitch between adjacent chambers in at least one of said plurality of processing islands.

26. The apparatus of claim 22, wherein each holding element is formed as a pallet configured to centrally support a substrate, and the substrate exchange apparatus includes at least one frame for supporting the substrate about a perimeter thereof, the frame configured to be moved from a first position below the pallet to a second position above the pallet for acquiring the substrate from the pallet, the frame having a perimeter gap to permit passage of a pallet support element during exchange of the substrate between the pallet and the frame.

27. The apparatus of claim 22, wherein each holding element has a C-shaped structure with a first substrate holding moiety forming a top of the C-shaped structure.

28. An apparatus for performing thin film processing on substrates, comprising:
   a plurality of processing islands arranged along a work flow path, wherein each processing island comprises an exterior, an interior, and at least one valve for exchange of a selected number of the substrates between the exterior and the interior thereof;

a substrate delivery and removal system;

a track which is adjacent to the work flow path; and a substrate exchange apparatus to retrieve the selected number of the substrates from the substrate delivery and removal system, introduce the selected number of the substrates into the interior of the processing island, extract the selected number of the substrates from the processing island, and return the selected number of the substrates to the delivery and removal system;

wherein the substrate exchange apparatus is moveable along the track between a first position at which the selected number of the substrates can be retrieved from the delivery and removal system or returned to the delivery and removal system, and an exchange position at which the selected number of the substrates can be transferred between the interior and exterior of the plurality of processing islands.

29. The apparatus of claim 28, wherein at least one of the processing islands includes at least one processing chamber separated from the substrate delivery and removal system.

30. The apparatus of claim 28, wherein the track has a first terminus at the first position and a second terminus at the second position.

31. The apparatus of claim 28, wherein the track has a first side and a second side, and the processing islands lie along the first and second sides of the track.

32. The apparatus of claim 28, wherein the substrate delivery and removal system includes:

a plurality of cassettes to hold a plurality of substrates; and a cassette loading system to position the substrates on the cassettes.

33. The apparatus of claim 28, wherein there are a plurality of processing islands, each including:

a first load lock chamber having a first valve through which the selected number of the substrates can be introduced therein; and at least one processing chamber;

wherein for each processing island, said substrate exchange apparatus may be moved to at least one exchange position to introduce the selected number of the substrates into the first load lock chamber.

34. The apparatus of claim 33, wherein said processing chamber includes one or more chambers configured to perform at least one of a CVD process, a PECVD process, an etching process, a cleaning process, a descumming process, a PVD process, a post-anneal process, or a combination thereof.

35. The apparatus of claim 28, wherein the second position is a service position at which the substrate exchange apparatus is accessible for maintenance or replacement.

36. An apparatus for performing thin film processing on substrates, comprising:

a substrate delivery and removal system;

a processing island including:

a first load lock chamber having a first valve by which a substrate can be introduced into the first load lock chamber;

at least one processing chamber, and a second load lock chamber having a second valve by which a substrate can be extracted from the second load lock chamber; and a substrate exchange apparatus to retrieve substrates from the delivery and removal system, introduce substrates into the first load lock chamber, extract substrates from the second load lock chamber, and return substrates to the delivery and removal system, wherein the substrate exchange apparatus is moveable between:

a first position at which substrates can be retrieved from the delivery and removal system;

an introduction position, remote from the first position, at which substrates can be introduced into the first load lock chamber; and an extraction position, remote from said first position and said introduction position, at which substrates can be extracted from the second load lock chamber;

wherein the substrate exchange apparatus is moveable along a track which runs between the first position, the introduction position and the extraction position, and is adjacent to said processing island.

37. The apparatus of claim 36, wherein the processing chamber is separated from the substrate delivery and removal system by at least one of the load lock chambers.

38. An apparatus for performing thin film processing on substrates, comprising:

first and second conveyors on which substrates can be supported as they move in respective first and second flow paths;

a plurality of processing islands associated with the first and second flow paths and each processing island including:

an exterior, an interior, and at least one valve to exchange substrates between the exterior and the interior;

an apparatus associated with each processing island by which substrates can be retrieved from the conveyor, introduced into the interior of the processing island, extracted from the processing island, and transferred to the conveyor; and at least one bypass robot by which substrates can be acquired from a first location along the first flow path and transferred to a second location along the second flow path, the bypass robot including:

an end effector to engage substrates;

a first actuator to vertically translate the end effector;

a second actuator to rotate the end effector about a vertical axis; and a third actuator to horizontally translate the end effector.

39. The apparatus of claim 38, wherein at least one of the processing islands includes at least one processing chamber separated from the substrate delivery and removal system.

40. An apparatus for performing thin film processing on substrates, comprising:

a plurality of processing islands, each processing island including;

an exterior, an interior, at least one load lock chamber having a valve to exchange the substrates between the exterior and the interior; and at least one processing chamber;

a substrate delivery and removal system;

a substrate exchange apparatus by which the substrates can be retrieved from the substrate delivery and removal system, introduced into the interior of the plurality of processing islands, extracted from the plurality of processing islands, and returned to the delivery and removal system; and at least one substrate buffer chamber to store the substrates prior to or after processing.

41. An apparatus for performing thin film processing on substrates, comprising:
   a substrate holding area;
   a plurality of processing islands, each processing island including:
      at least one load lock chamber having a valve to exchange the substrates between the exterior and the interior; and
      at least one processing chamber;
   a track passing adjacent to each of said processing islands; and
   a substrate exchange apparatus movable along the track to retrieve substrates from the substrate holding area, introduce substrates into the load lock chamber of a processing island, extract substrates from the processing island, and return substrates to the substrate holding area, wherein the track includes at least two modular tracks with conjunctible interfaces, the track being configured or extended by combining a plurality of said modular tracks, wherein the processing chamber is separated from the substrate exchange apparatus by the load lock chamber.

42. An apparatus for performing a process on a substrate, comprising:
   a conveyor to support a substrate as it moves along a flow path;
   a plurality of processing islands located adjacent to said flow path, each processing island including a load lock heating chamber through which a substrate may be introduced into said processing island and in which a substrate can be heated, a processing chamber in which a process may be performed on the substrate after it is heated, and a load lock cooling chamber in which the substrate may be cooled after it has been subjected to the process in said processing chamber; and
   a substrate transfer mechanism configured and arranged to transfer the substrate between said conveyor and selected number of said processing islands, wherein the processing chamber is separated from the substrate transfer mechanism by at least one of the load lock chambers.

43. An apparatus for performing a process on a number of substrates, comprising:
   a conveyor to support the number of substrates along a work flow path at a number of predetermined positions separated by a first pitch;
   a plurality of substrate transfer mechanisms configured and arranged to remove the substrates from and place the substrates on said conveyor; and
   a plurality of processing islands located along said flow path, at least one of said plurality of processing islands having at least one load lock chamber and at least one processing chamber disposed adjacent the load lock chamber, wherein said chambers are separated by a second pitch which is substantially the same or an integer multiple of the first pitch.

44. An apparatus to perform a process on a substrate, comprising:
   a substrate processing path having a first end and a second end;
   a substrate storage location at the first end of the substrate processing path;
   a plurality of process chambers located adjacent the processing path between the first end and the second end of the processing path, wherein at least one of the process chambers is part of a processing island which comprises:
      an entry load lock chamber having a first valve through which a substrate can be introduced therein; and
      an exit load lock chamber having a second valve through which a substrate can be extracted therefrom; and
   a transfer robot movable along the processing path to retrieve a substrate from the substrate storage location and deliver the substrate to an exchange position in at least one of the load lock chambers from where the substrate can be introduced into the plurality of process chambers, wherein the substrate is rotated approximately ninety degrees from the direction of movement along the processing path to the exchange position.

45. The apparatus of claim 44 wherein the substrate is removed from the selected process chamber by the transfer robot and rotated approximately ninety degrees before being returned to the storage location.

46. The apparatus of claim 45 wherein the transfer robot is movable along the processing path in a first direction to deliver the substrate to the exchange position and in a second direction opposite the first direction to return the substrate to the storage location.

47. The apparatus of claim 44 wherein the processing path has a first side and a second side, and the process chambers are located along the first and second sides of the processing path.

48. The apparatus of claim 44 further including a track extending along the processing path on which the transfer robot moves.

49. The apparatus of claim 48 wherein the transfer robot is moveable along the track to a service position where it is accessible for maintenance or replacement, the service position being located at the second end of the processing path.

50. The apparatus of claim 44 wherein at least one of the process chambers is separated from the transfer robot by at least one of the load lock chambers.

51. The apparatus of claim 44 wherein the entry load lock chamber is a heating chamber.

52. The apparatus of claim 44 wherein the exit load lock chamber is a cooling chamber.

53. The apparatus of claim 44 wherein the process chambers include one or more chambers configured to perform at least one of a CVD process, a PECVD process, an etching process, a cleaning process, a descumming process, a PVD process, and a post-anneal process.

54. The apparatus of claim 44 wherein the transfer robot includes an end effector to support the substrate, a horizontal linear actuator to horizontally translate the end effector, a vertical linear actuator to vertically translate the end effector, and a vertical rotary actuator to rotate the end effector about a vertical axis.

55. An apparatus to perform a process on a substrate, comprising:
   a substrate processing path having a first end and a second end;
   a means for storing a substrate at the first end of the substrate processing path;
   a plurality of process chambers located adjacent to the processing path between the first end and the second end of the processing path;
   at least one load lock chamber associated with the process chambers;
   a means movable along the processing path for retrieving a substrate from the means for storing and delivering the substrate to an exchange position in the load lock chamber associated with a selected number of the process chambers from where it can be introduced into the selected number of the process chambers, wherein the substrate being moved into the exchange position in a direction that is substantially perpendicular to the processing path.

56. An apparatus for performing a process on a substrate, comprising:
a conveyor to support the substrate along a flow path;
a substrate transfer mechanism configured and arranged to remove the substrate from and place another substrate on said conveyor; and
at least one inspection station for inspection of the substrate located adjacent to said flow path, said inspection station having a valve for introduction and extraction of the substrate into and out of an interior thereof.

57. An apparatus for performing a process on a substrate, comprising:
a conveyor to support the substrate along a flow path, wherein said conveyor includes a plurality of substrate holding elements;
a substrate transfer mechanism configured and arranged to remove the substrate from and place another substrate on said conveyor; and
at least one processing island located adjacent to said flow path, said processing island having a valve for introduction and extraction of the substrate into and out of an interior thereof.

58. An apparatus for performing a process on a substrate, comprising:
a conveyor to support the substrate along a flow path;
a substrate transfer mechanism configured and arranged to remove the substrate from and place another substrate on said conveyor;
at least one processing island located adjacent to said flow path, said processing island having a valve for introduction and extraction of the substrate into and out of an interior thereof; and
at least one substrate stacker to hold substrates prior to or after processing.

59. An apparatus for performing a process on a substrate, comprising:
a conveyor to support the substrate along a flow path;
a substrate transfer mechanism configured and arranged to remove the substrate from and place another substrate on said conveyor, wherein said substrate transfer mechanism includes an end effector for supporting the substrate, a horizontal linear actuator for horizontally translating the end effector, and a vertical linear actuator for vertically translating the end effector; and
at least one processing island located adjacent to said flow path, said processing island having a valve for introduction and extraction of the substrate into and out of an interior thereof.

60. The apparatus of claim 59, wherein the end effector is fork-shaped.

61. The apparatus of claim 59, wherein said substrate transfer mechanism includes a vertical rotary actuator for rotating the end effector about a vertical axis.

62. An apparatus for performing a process on a substrate, comprising:
a conveyor to support the substrate along a flow path;
a substrate transfer mechanism configured and arranged to remove the substrate from and place another substrate on said conveyor; and at least one processing island located adjacent to said flow path, said processing island having a valve for introduction and extraction of the substrate into and out of an interior thereof;
wherein said substrate transfer mechanism is moveable from a position directly below the substrate on said conveyor when the substrate is in a stopped position adjacent said processing island, to a position engaging the substrate, and then to a final position wherein the substrate is positioned above the conveyor.

63. An apparatus for performing a process on a substrate, comprising:
a conveyor to support the substrate along a flow path;
a substrate transfer mechanism configured and arranged to remove the substrate from and place another substrate on said conveyor; and
at least one processing island located adjacent to said flow path, said processing island having a valve for introduction and extraction of the substrate into and out of an interior thereof;
wherein said processing island includes an entry load lock chamber, a processing chamber and an exit load lock chamber.

64. The apparatus of claim 63, wherein said entry load lock chamber is a heating chamber and said exit load lock chamber is a cooling chamber.

65. An apparatus for performing a thin film process on a substrate, comprising:
a conveyor to support a substrate as it moves along a flow path;
a plurality of processing islands located along the flow path, each processing island comprising an exterior, an interior, and at least one valve for exchange of the substrate between the exterior and the interior; and
a substrate exchange apparatus configured and arranged to retrieve a substrate from the conveyor, introduce the substrate into the interior of a selected processing island, extract the substrate from the interior of the selected processing island, and replace the substrate on the conveyor, wherein the substrate exchange apparatus includes:
a first robot for retrieving the substrate from the conveyor and introducing the substrate into the interior of the selected processing island; and
a second robot for extracting the substrate from the interior of the selected processing island and positioning the substrate on the conveyor.

66. An apparatus for performing a thin film process on a substrate, comprising:
a conveyor to support a substrate as it moves along a flow path;
a plurality of processing islands located along the flow path, each processing island comprising an exterior, an interior, and at least one valve for exchange of the substrate between the exterior and the interior; and
a substrate exchange apparatus configured and arranged to retrieve the substrate from the conveyor, introduce the substrate into the interior of a selected processing island, extract the substrate from the interior of the selected processing island, and replace the substrate on the conveyor, wherein the substrate exchange apparatus includes:
a loader having an end effector for retrieving the substrate from the conveyor and introducing the substrate into the interior of the selected processing island; and an unloader having an end effector for extracting the substrate from the interior of the selected processing island and positioning the substrate on the conveyor.

67. The apparatus of claim 66, wherein the end effector has the shape of a fork.

68. An apparatus for performing a thin film process on a substrate, comprising:
a conveyor to support a substrate as it moves along a flow path, wherein the flow path is a continuous loop;
a plurality of processing islands located along the flow path, each processing island comprising an exterior, an interior, and at least one valve for exchange of the substrate between the exterior and the interior; and
a substrate exchange apparatus configured and arranged to retrieve the substrate from the conveyor, introduce the substrate into the interior of a selected processing island, extract the substrate from the interior of the selected processing island, and replace the substrate on the conveyor.

69. An apparatus for performing a thin film process on a substrate, comprising:
a conveyor to support a substrate as it moves along a flow path, wherein the conveyor has a plurality of individual holding elements, each for holding a substrate;
a plurality of processing islands located along the flow path, each processing island comprising an exterior, an interior, and at least one valve for exchange of the substrate between the exterior and the interior; and
a substrate exchange apparatus configured and arranged to retrieve the substrate from the conveyor, introduce the substrate into the interior of a selected processing island, extract the substrate from the interior of the selected processing island, and replace the substrate on the conveyor.

70. The apparatus of claim 69, wherein the pitch between adjacent individual holding elements and the pitch between adjacent chambers in a processing island is substantially uniform.

71. The apparatus of claim 70, wherein the pitch between adjacent individual holding elements is substantially equal to the pitch between adjacent chambers in each of said plurality of processing islands.

72. The apparatus of claim 70, wherein the pitch between adjacent individual holding elements is substantially equal to the pitch between adjacent chambers in at least one of said plurality of processing islands.

73. The apparatus of claim 69, wherein each holding element is formed as a pallet configured to centrally support a substrate, and the substrate exchange apparatus includes at least one frame for supporting the substrate about a perimeter thereof, the frame configured to be moved from a first position below the pallet to a second position above the pallet for acquiring the substrate from the pallet, the frame having a perimeter gap to permit passage of a pallet support element during exchange of the substrate between the pallet and the frame.

74. The apparatus of claim 69, wherein each holding element has a C-shaped structure with a first substrate holding moiety forming a top of the C-shaped structure.

75. An apparatus for performing thin film processing on substrates, comprising:
at least one processing island arranged along a work flow path, wherein the processing island including an exterior, an interior, and at least one valve for exchange of a selected one of the substrates between the exterior and the interior;
a substrate delivery and removal system, wherein the substrate delivery and removal system includes:
a plurality of cassettes to hold a plurality of substrates; and
a cassette loading system to position the substrates on the cassettes; and
a substrate exchange apparatus to retrieve the selected one of the substrates from the substrate delivery and removal system, introduce the selected one of the substrates into the interior of the processing island, extract the selected one of the substrates from the processing island, and return the selected one of the substrates to the delivery and removal system;
wherein the substrate exchange apparatus is moveable along the work flow path between a first position at which the selected one of the substrates can be retrieved from the delivery and removal system, or returned to the delivery and removal system, and an exchange position at which the selected one of the substrates can be transferred between the interior and exterior of the processing island.

76. An apparatus for performing thin film processing on substrates, comprising:
a plurality of processing islands arranged along a work flow path, wherein each processing island includes an exterior, an interior, and at least one valve for exchange of a selected number of the substrates between the exterior and the interior;
a substrate delivery and removal system; and
a substrate exchange apparatus to retrieve the selected number of the substrates from the substrate delivery and removal system, introduce the selected number of the substrates into the interior of the processing island, extract the selected number of the substrates from the processing island, and return the selected number of the substrates to the delivery and removal system;
wherein the substrate exchange apparatus is moveable along the work flow path between a first position at which the selected number of the substrates can be retrieved from the delivery and removal system, or returned to the delivery and removal system, and an exchange position at which the selected number of the substrates can be transferred between the interior and exterior of the processing island;
wherein each processing island includes:
a first load lock chamber having a first valve through which the selected number of the substrates can be introduced therein; and
at least one processing chamber;
wherein for each processing island, said substrate exchange apparatus may be moved to at least one exchange position to introduce the selected number of the substrates into the first load lock chamber.

77. The apparatus of claim 76, wherein said processing chamber includes one or more chambers configured to perform at least one of a CVD process, a PECVD process, an etching process, a cleaning process, a descumming process, a PVD process, a post-anneal process, or a combination thereof.

78. An apparatus to perform a process on a substrate, comprising:
a substrate storage location at a first end of a substrate processing path;
a plurality of process chambers located adjacent to the processing path between the first end and a second end of the processing path; and a transfer robot movable along the processing path to retrieve a substrate from the substrate storage location, move the substrate along the processing path, and deliver the substrate to an exchange position associated with a selected one of the process chambers from where the substrate can be introduced into the selected one of the process chambers, wherein the substrate is rotated approximately ninety degrees from the direction of movement along the processing path to the exchange position;

wherein the substrate is removed from the selected one of the process chambers by the transfer robot and rotated approximately ninety degrees before being returned to the storage location.

79. The apparatus of claim 78 wherein the transfer robot is movable along the processing path in a first direction to deliver the substrate to the exchange position and in a second direction opposite the first direction to return the substrate to the storage location.

80. An apparatus to perform a process on a substrate, comprising:

a substrate storage location at a first end of a substrate processing path;

a plurality of process chambers located adjacent to the processing path between the first end and a second end of the processing path; and a transfer robot movable along the processing path to retrieve a substrate from the substrate storage location, move the substrate along the processing path, and deliver the substrate to an exchange position associated with a selected one of the process chambers from where the substrate can be introduced into the selected one of the process chambers, wherein the substrate is rotated approximately ninety degrees from the direction of movement along the processing path to the exchange position;

wherein the processing path has a first side and a second side, and the process chambers are located along the first and second sides of the processing path.

81. An apparatus to perform a process on a substrate, comprising:

a substrate storage location at a first end of a substrate processing path;

a plurality of process chambers located adjacent to the processing path between the first end and a second end of the processing path;

a transfer robot movable along the processing path to retrieve a substrate from the substrate storage location, move the substrate along the processing path, and deliver the substrate to an exchange position associated with a selected one of the process chambers from where the substrate can be introduced into the selected one of the process chambers, wherein the substrate is rotated approximately ninety degrees from the direction of movement along the processing path to the exchange position; and a track extending along the processing path on which the transfer robot moves.

82. The apparatus of claim 81 wherein the transfer robot is moveable along the track to a service position where it is accessible for maintenance or replacement, the service position being located at the second end of the processing path.

83. An apparatus to perform a process on a substrate, comprising:

a substrate storage location at a first end of a substrate processing path;

a plurality of process chambers located adjacent to the processing path between the first end and a second end of the processing path; and a transfer robot movable along the processing path to retrieve a substrate from the substrate storage location, move the substrate along the processing path, and deliver the substrate to an exchange position associated with a selected one of the process chambers from where the substrate can be introduced into the selected one of the process chambers, wherein the substrate is rotated approximately ninety degrees from the direction of movement along the processing path to the exchange position;

wherein the transfer robot includes an end effector to support the substrate, a horizontal linear actuator to horizontally translate the end effector, a vertical linear actuator to vertically translate the end effector, and a vertical rotary actuator to rotate the end effector about a vertical axis.

* * * * *

UNITED STATES PATENT AND TRADEMARK OFFICE
CERTIFICATE OF CORRECTION

PATENT NO. : 6,235,634 B1
DATED : May 22, 2001
INVENTOR(S) : White et al.

It is certified that error appears in the above-identified patent and that said Letters Patent is hereby corrected as shown below:

Column 3,
Line 51, please replace " ie." with -- i.e. --.

Column 9,
Line 27, please replace " zlinear" with -- z-linear --.

Column 14,
Line 30, please replace " fixes" with -- fixtures --.

Signed and Sealed this

Eighteenth Day of December, 2001

Attest:

Attesting Officer

JAMES E. ROGAN
Director of the United States Patent and Trademark Office